United States Patent
Shinada et al.

[11] Patent Number: 6,121,553
[45] Date of Patent: Sep. 19, 2000

[54] CIRCUIT BOARDS USING HEAT RESISTANT RESIN FOR ADHESIVE LAYERS

[75] Inventors: Eiichi Shinada, Ibaraki-ken; Masao Kanno, Oyama; Yuuichi Shimayama; Yoshiyuki Tsuru, both of Shimodate; Takeshi Horiuchi, Tochigi-ken, all of Japan

[73] Assignee: Hitachi Chemical Company, Ltd., Tokyo, Japan

[21] Appl. No.: 08/957,011

[22] Filed: Oct. 23, 1997

[30] Foreign Application Priority Data

| Mar. 3, 1997 | [JP] | Japan | 9-047454 |
| Mar. 3, 1997 | [JP] | Japan | 9-047697 |
| Mar. 28, 1997 | [JP] | Japan | 9-076802 |

[51] Int. Cl.$^7$ ........................................ H05K 1/03
[52] U.S. Cl. ................ 174/259; 174/255; 174/266; 428/209; 428/901
[58] Field of Search .............................. 174/251, 255, 174/259, 261, 266, 52.4; 361/784, 792; 29/829, 846, 850; 156/182, 307.1, 307.7, 325, 330; 428/901, 528, 209

[56] References Cited

U.S. PATENT DOCUMENTS

| 5,403,869 | 4/1995 | Arike et al. .................. 428/901 X |
| 5,486,655 | 1/1996 | Arike et al. . |
| 5,622,588 | 4/1997 | Weber ........................ 174/52.4 X |
| 5,625,166 | 4/1997 | Natarajan ..................... 174/52.4 |
| 5,650,593 | 7/1997 | McMillan et al. ............. 174/52.4 |

FOREIGN PATENT DOCUMENTS

| 0457722A2 | 11/1991 | European Pat. Off. . |
| 3520258C2 | 1/1986 | Germany . |
| 5-337937 | 12/1999 | Japan . |

Primary Examiner—Hyung-Sub Sough
Attorney, Agent, or Firm—Antonelli, Terry, Stout & Kraus, LLP

[57] ABSTRACT

An adhesive composition including (a) a polyamide-imide resin preferably having a molecular weight of 80,000 or more and (b) a thermosetting component preferably including an epoxy resin and a curing agent and/or a curing accelerator therefor is used for providing an insulating adhesive layer having a storage elastic modulus at 300° C. of 30 MPa or more and a glass transition temperature of 180° C. or higher. The insulating adhesive is suitable for use in wire scribed circuit boards, multilayer printed circuit boards, and circuit boards for chip carriers.

3 Claims, 21 Drawing Sheets

CIRCUIT BOARDS USING HEAT RESISTANT RESIN FOR ADHESIVE LAYERS

BACKGROUND OF THE INVENTION

This invention relates to wire scribed circuit boards, multilayer printed circuit boards and circuit boards for chip carrier using a heat resistant resin adhesive composition for the insulating adhesive layers, and processes for producing these circuit boards.

The wire scribed circuit boards have a structure in which the adhesive layers are provided on the substrates, and a plurality of wires having an insulating coating for forming conductor circuits are scribed and fixed in said layers, with the interlayer connections being made by through holes, and such circuit boards are disclosed in U.S. Pat. Nos. 4,097,684, 3,646,572, 3,674,914 and 3,674,602. They are known as the printed circuit boards which are capable of high-density wiring and advantageous for matching of characteristic impedance and reduction of crosstalks.

In the prior art, insulation resistance of the circuit boards was well within the range of permissible error for the conventional wiring density, and posit- ional precision of wires was also acceptable for practical use because of low wiring density and large hole size although there would usually be observed wire swimming of approximately 0.2 mm against the design value after wiring, lamination and bonding of the printed circuit boards.

However, increase of wiring density such as seen in recent years may lead to an excessive reduction of insulation resistance when a rubber-based adhesive is used for bonding. Also, higher wiring density entails smaller hole size, and further, enlargement of wire swimming tends to cause displacement of the insulating coated wires at the positions where through holes are to be formed, giving rise to the problem of improper wire connection.

As a solution to this problem, UV curing adhesive sheets using a phenol resin, an epoxy resin, an epoxy-modified-polybutadiene or the like as adhesive, such as disclosed in JP-B-5-164525, have been proposed. In the conventional methods, prepregs have been laminated after fixing the wires having an insulating coating. In these methods, since wire swimming is enlarged when prepregs are laminated after wiring by use of said type of adhesive, it is tried to control wire swimming by adding a preliminary curing step between the wiring step and the laminating step to cause a slight degree of curing of the adhesive layer. However, increase of the laminations has posed the problem of reduced solder heat resistance because of the enlarged difference in thermal expansion coefficient between the prepreg or substrate and the adhesive at the glass transition point or above.

On the other hand, the multilayer printed circuit boards usually comprise an interlayer substrate containing a power source layer and a ground layer, a plurality of prepreg layers having circuit conductors thereon on the surface of the interlayer substrate, via holes for electrical connection of only necessary circuit conductors, plated-through holes for electrical connection of necessary circuit conductors through all the laminated layers, and a solder resist for insulating the surface circuits.

Many methods are known for producing such multilayer printed circuit boards. A typical and commonly known method comprises the steps of etching away unnecessary portions of a copper foil of a copper-clad laminate to form internal circuits and interlayer substrate which constitutes a power source layer and a ground layer, placing thereon prepregs and copper foils and pressing them with heating for integral lamination, etching away unnecessary portions of the copper foil and repeating the placing of prepregs and the circuit formation for required times, drilling holes in portions necessary for electrical connection, metallizing the inner walls of said holes by electroless plating or other appropriate means, etching away unnecessary portions of the surface copper foils, and coating a solder resist, followed by drying.

A method is also well known in which the interlayer substrates for the respective layers are separately produced, and after positioning with guide pins, these substrates are integrally laminated and drilled to form through holes, followed by formation of surface circuits and a solder resist.

The recent tendency toward smaller size, higher performance and multiplication of functions of electronic devices has further prompted the effort for realizing higher wiring density of the multilayer printed wiring boards. Such efforts for attaining higher wiring density have materialized further reduction of interlayer thickness, wire size and interlayer connecting hole diameter, and use of interstitial via holes (IVH) which connect the adjoining wiring layers alone. Reduction of size of IVH and multiplication of layers are now required for attaining higher density of the wiring boards.

A built-up wiring board of a structure in which the insulating layers and the conductor circuits are laminated alternately on the outer surface of an interlayer substrate has been proposed as an example of printed circuit board of a multilayer structure.

A commonly practiced procedure for producing the built-up wiring boards is shown here. On the outer surface of an interlayer substrate having the interlayer circuits thereon is formed an insulating layer, which is the first layer of the laminate, by coating and curing an adhesive for additive.

The "adhesive for additive" means an adhesive for forming conductor circuits on the surface thereof by electroless plating.

Then the holes for forming IVH are formed at the necessary portions of the insulating layer by laser beam drilling, wet etching or photo etching method.

Laser beam drilling is a technique for making holes by applying laser beams to the pertinent spots of the insulating layer to cause evaporation of the layer material at the spots. Wet etching is a method in which the pertinent portions of the insulating layer are etched away with a chemical etching solution. Photo etching method is a method in which the pertinent portions of the insulating layer are selectively photocured, with the other portions removed by development.

A surface roughening treatment is carried out on the interlaminar insulating layer, and a catalyst for depositing electroless copper plating is applied to the roughened surface to form a thin deposit of electroless copper plating. Then the current paths for performing electroplating are formed and electroplating is carried out thereon to a necessary thickness to form an etching resist. The portions where no etching resist has been formed are selectively removed by etching to form outer layer wiring.

The interlaminar insulating layer and conductor layer forming the second layer can be formed basically by repeating the process of the built-up board producing method described above.

Reduction of the insulating layer thickness has been proposed for realizing thickness reduction of the multilayer printed circuit boards. There is a limitation on the degree of thickness reduction that can be achieved when prepregs containing reinforcements such as glass cloth are used for the insulating layers, so a resin sheet containing no glass cloth or like reinforcements has recently been developed as an improved insulating layer.

When plating is conducted on a recessed portion such as IVH, there is formed a depression in the middle of IVH, and if the second built-up layer is formed with said depression left, unevenness is produced on the substrate surface to make a substrate poor in flatness, resulting in a reduced bonding precision in mounting of parts or shortcircuiting or disconnection of lines in the wiring step.

Also, increase of the layers containing no reinforcements such as glass cloth in the PC boards gives rise to the problem that voids tend to be formed in the interlaminar insulating layers or separation thereof tends to take place due to the difference in glass transition point, linear expansion coefficient or storage elastic modulus between said insulating layers and the interlayer substrates.

Regarding the semiconductor chip packages, JP-A-59-158579 taught a structure in which the terminals connected to the semiconductor chips are led out from the inside to a part on the outside of the package to constitute a leadless chip carrier.

Also, JP-B-58-11100 disclosed a pin grid array having a plurality of rows of terminal pins for connection to the through holes in the other package-mounting boards, and a process for producing such a pin grid array.

JP-B-58-11100 also disclosed a ball grid array in which the balls are fused and soldered to the lands, in place of the pins in pin grid arrays, to thereby make electrical connections.

Further, JP-B-58-26828 proposed to initially form the terminals and then insulate tape-like films to constitute an automated tape carrier.

In these semiconductor chip packages (hereinafter referred to as "wiring boards for chip carriers"), ceramic materials have been popularly used as insulator, and semiconductor chip terminals were electrically connected to these chip carriers by wire bonding. organic insulating materials have been used as sealant for protecting the semiconductor chips or the connected portions from environmental attack after mounting of the semiconductor chips on said chip carriers.

Further, in recent years, in view of poor economy of use of conventional ceramic materials for chip carriers because of the increased number of calcination steps, the chip carrier producing methods utilizing the so-called multilayer wiring board manufacturing techniques using an organic insulating material have been developed. For example, JP-B-3-25023 disclosed a method for producing pin grid array packages using an organic insulating material.

In the field of wiring boards for chip carriers, too, there has recently been increasing request for size reduction and functional multiplication of the electronic devices, and the necessity for higher density of wiring and size reduction has become intense. Slimming has also been required for the insulating material used for the insulating adhesive layers interposed between the interlayer circuits, and it has now become hardly possible for the conventional prepregs to adapt themselves to the desired thickness of glass fabric or nonwoven cloth used therefor. This has prompted the attempts to coat an insulating resin or to make a film thereof.

However, use of a prepreg containing no reinforcement such as glass fabric or nonwoven fabric for the insulating adhesive layers has a tendency to encourage formation of voids in or peeling of the insulating adhesive layers, giving rise to the problem of unreliability of connection or lowering of solder heat resistance.

SUMMARY OF THE INVENTION

It is an object of the present invention to provide a wire scribed circuit board using for its insulating adhesive layers an adhesive of a specific composition which has many excellent properties and is capable of inhibiting reduction of solder heat resistance due to multiplication of interlayers.

Another object of the present invention is to provide a multilayer printed circuit board using an adhesive of a specific composition for the insulating adhesive layers, said circuit board being capable of high density wiring, allowing use of fine wires and reduction of board thickness, and having high heat resistance and connection reliability, regardless of whether via holes are present or not, and a process for producing such a multilayer printed circuit board at high efficiency.

Still another object of the present invention is to provide a circuit board for chip carrier, especially the one for semiconductor chip packaging, which uses an adhesive of a specific composition for the insulating adhesive layers and has high connection reliability and solder heat resistance.

The present invention provides a wire scribed circuit board comprising an insulating substrate having conductor circuit thereon, an insulating adhesive layer formed thereon, a plurality of wires having an insulating coating and fixed in said insulating adhesive layer, and a plurality of plated through holes formed in portions necessary for electrical connection, said insulating adhesive layer having a storage elastic modulus at 300° C. of 30 MPa or more and a glass transition temperature of 180° C. or higher, and made from an adhesive composition comprising a polyamide-imide resin and a thermosetting component, and a process for producing such a wire scribed circuit board.

The present invention also provides a multilayer printed circuit board comprising a plurality of insulating substrates having conductor circuits thereon, insulating adhesive layers interposed between said insulating substrates alternately, and a plurality of plated through holes electrically connecting conductor circuits, said insulating adhesive layer having a storage elastic modulus at 300° C. of 30 MPa or more and a glass transition temperature of 180° C. or higher, and made from an adhesive composition comprising a polyamide-imide resin and a thermosetting component, and a process for producing such a multilayer printed circuit board.

The present invention further provides a circuit (or wiring) board for chip carrier comprising a plurality of insulating layers, a plurality of interlayer substrates having conductor circuits on individual insulating layers, a plurality of insulating adhesive layers, each insulating adhesive layer bonding each insulating layer and each interlayer substrate or each insulating layer, a plurality of through holes having conductors on the inner wall surfaces thereof and electrically connected to the conductor circuits, and a cavity for housing at least one semiconductor chip, said insulating adhesive layer having a storage elastic modulus at 300° C. of 30 MPa or more and a glass transition temperature of 180° C. or higher, and made from an adhesive composition comprising a polyamide-imide resin and a thermosetting component, and a process for producing such a circuit board for chip carrier.

DESCRIPTION OF THE PREFERRED EMBODIMENTS

Figure 1A:
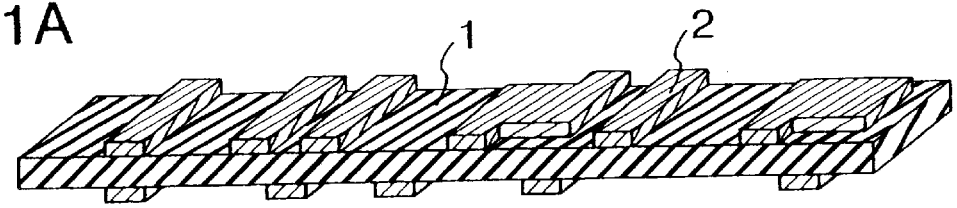
FIGS. 1A to 1H are schematic sectional views illustrating the sequential steps in the manufacture of a wire scribed circuit board in an embodiment of the present invention.

The present inventors found that the problems in the prior art such as mentioned above can be solved by using a specific heat resistant resin adhesive composition for the insulating adhesive layers in the wire scribed circuit boards, multilayer printed circuit boards and circuit boards for chip carrier according to the present invention. The present invention has been attained on the basis of this finding.

[Heat resistant resin adhesive composition]

The heat resistant resin adhesive composition used for forming the insulating adhesive layers in the various types of wiring boards in the present invention comprises (a) a polyamide-imide resin and (b) a thermosetting component.

The polyamide-imide resin (a) used in the present invention preferably has a molecular weight of 80,000 or more. If the molecular weight of the polyamide-imide resin used is less than 80,000, the produced adhesive sheet may prove poor in flexibility and handling characteristics, and especially in the wire scribed circuit boards wire swimming tends to take place when heat pressing is conducted immediately after wire scribing.

As the polyamide-imide resin, it is preferred to use an aromatic polyamide-imide resin which can be obtained by reacting an aromatic diimide dicarboxylic acid represented by the formula (1) with an aromatic diisocyanate represented by the formula (2), said aromatic diimide dicarboxylic acid of the formula (1) being obtainable by reacting a diamine having 3 or more aromatic rings with a trimellitic acid anhydride; or an aromatic polyamide-imide resin obtainable by reacting 2,2-bis[4-{4-(5-hydroxycarbonyl-1,3-dione-isoindolino)phenoxy}phenyl]propane as aromatic diimidodicarboxylic acid with 4,4'-diphenylmethane diisocyanate as aromatic diisocyanate.

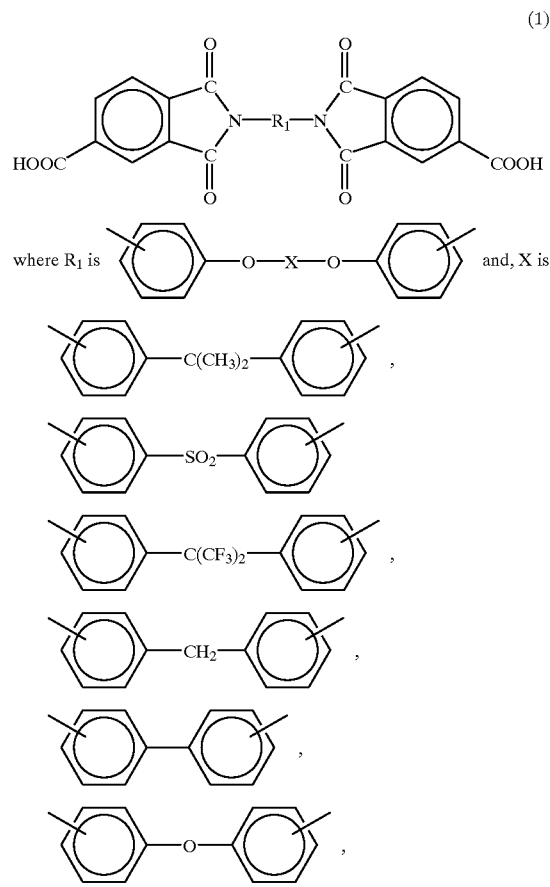

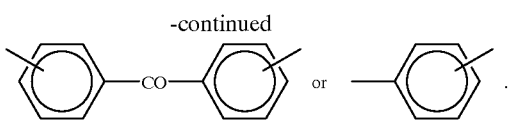

$$OCN-R_3-NCO \quad (2)$$

wherein $R_3$ is

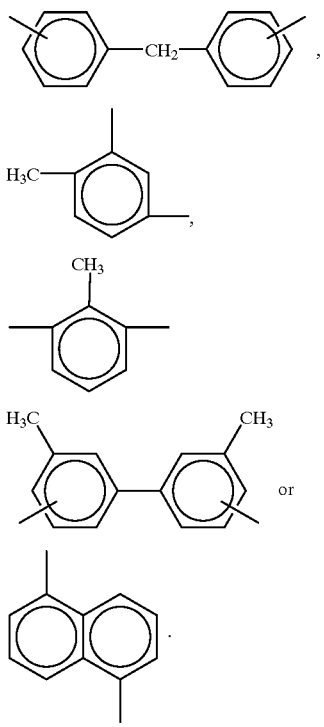

Examples of the diamines having 3 or more aromatic rings usable in this invention include 2,2-bis[4-(4-aminophenoxy)phenyl]propane, bis[4-(3-aminophenoxy)phenyl]sulfone, bis[4-(4-aminophenoxy)phenyl]-sulfone, 2,2-bis[4-(4-aminophenoxy)phenyl]hexafluoropropane, bis[4-(4-aminophenoxy)phenyl]methane, 4,4-bis(4-aminophenoxy)biphenyl, bis[4-(4-aminophenoxy)phenyl] ether, bis[4-(4-aminophenoxy)phenyl]ketone, 1,3-bis(4-aminophenoxy)benzene, and 1,4-bis(4-aminophenoxy)benzene. These diamines may be used either singly or as a mixture thereof.

Examples of the aromatic diisocyanates usable in this invention include 4,4'-diphenylmethane diisocyanate, 2,4-tolylene diisocyanate, 2,6-tolylene diisocyanate, naphthalene-1,5-diisocyanate, and 2,4-tolylene dimers, which may be used singly or in combination.

The thermosetting component (b) comprises an epoxy resin and a curing agent thereof or a curing accelerator thereof. It is preferable to use an epoxy resin having 2 or more glycidyl groups and a curing agent thereof, or an epoxy resin having 2 or more glycidyl groups and a curing accelerator thereof. The greater the number of the glycidyl groups, the better. Preferably the number of the glycidyl groups is 3 or more. The amount of the thermosetting resin component to be used varies depending on the number of the glycidyl groups. Specifically, the greater the number of the glycidyl groups is, the less may be the amount of the thermosetting resin component which needs to be used for bettering storage elastic modulus at 300° C. in C-stage. It is more preferable to use both a curing agent and a curing accelerator for the epoxy resin.

The liquid epoxy resins usable in this invention include bisphenol A epoxy resins (e.g. YD128 and YD8125, trade names, mfd. by Toto Kasei Kogyo K.K.; Ep815 and Ep828, trade names, mfd. by Yuka Shell Epoxy Co., Ltd.; and DER337, a trade name, mfd. by Dow Chemical Japan Co., Ltd.), and bisphenol F epoxy resins (e.g. YDF170 and YDF92004, trade names, mfd. by Toto Kasei Kogyo K.K.).

The solid epoxy resins usable in this invention include YD907, YDCN704S, YDPN172 and YP50 (trade names, mfd. by Toto Kasei Kogyo K.K.), Ep1001, Ep1010 and Ep180S70 (trade names, mfd. by Yuka Shell Epoxy Co., Ltd.), ESA019 and ESCN195 (trade names, mfd. by Sumitomo Chemical Co., Ltd.), DER667 and DEN438 (trade names, mfd. by Dow Chemical Japan Co., Ltd.), and EOCN1020 (a trade name, mfd. by Nippon Kayaku Co., Ltd.).

A brominated epoxy resin (e.g. YDB400, a trade name, mfd. by Toto Kasei Kogyo K.K.; Ep5050, a trade name, mfd. by Yuka Shell Epoxy Co., Ltd.; and ESB400, a trade name, mfd. by Sumitomo Chemical Co., Ltd.) may be used for improving flame retardancy.

These epoxy resins may be used singly, or a plural number of these epoxy resins may be selected and used in admixture as required.

The epoxy resin curing agent or curing accelerator may be of any type as far as it is capable of reacting with the epoxy resin used or accelerating its curing. For example, amines, imidazoles, polyfunctional phenols, acid anhydrides and isocyanates can be used as such a curing agent or curing accelerator.

The amines usable for said purpose include dicyandiamide, diaminodiphenylmethane and guanylurea. The imidazoles include alkyl-substituted imidazoles and benzimidazole. The polyfunctional phenols include hydroquinone, resorcinol, bisphenol A and their halides, novolaks which are the condensates with aldehyde, and resol resins. The acid anhydrides include phthalic anhydride, hexahydrophthalic anhydride and benzophenonetetracarboxylic acid. The isocyanates include tolylene diisocyanate, isophorone diisocyanate, and those isocyanates masked with a phenol. Polyfunctional phenols are preferred as curing agent, and imidazoles are recommendable as curing accelerator.

The curing agent or curing accelerator is used, in the case of amines, preferably in such an amount that the active hydrogen equivalent of the amine will become substantially equal to the epoxy equivalent of the epoxy group of the epoxy resin. For example, in the case of a primary amine which has 2 hydrogen atoms, the amount of the amine needs to be 0.5 equivalent to one equivalent of the epoxy resin. In the case of a secondary amine, there is required one equivalent of the amine.

In case of using an imidazole, its amount can not be simply expressed by an active hydrogen equivalent, but it is empirically preferred that its amount be 1 to 10 parts by weight per 100 parts by weight of the epoxy resin. In the case of a polyfunctional phenol or an acid anhydride, its amount is preferably 0.8 to 1.2 equivalents per equivalent of the epoxy resin.

In the case of an isocyanate, as it is reacted with both of the polyamide-imide resin and the epoxy resin, its amount needs to be 0.8 to 1.2 equivalents per equivalent of either of said resins.

These curing agents and curing accelerators may be used singly or as a mixture of two or more of them as desired.

If the amount of the curing agent or curing accelerator is too small, an uncured epoxy resin may be left to reduce the storage elastic modulus at 300° C. in C-stage, while too much amount of the curing agent or curing accelerator may cause retainment of the unreacted curing agent or curing accelerator to deteriorate insulating properties.

It is possible to enhance plate adhesion on the walls of through holes, or to incorporate a catalyst for electroless plating for producing wiring boards according to an additive method.

In the present invention, these components are mixed in an organic solvent to form a heat resistant resin composition. Any organic solvent capable of dissolving the components can be used, the examples of such solvent including dimethylacetamide, dimethylformamide, dimethyl sulfoxide, N-methyl-2-pyrrolidone, y-butyrolactone, sulfolane, cyclohexanone and the like.

The ratio of the thermosetting component (b) to the polyamide-imide resin (a) in the composition is preferably 10–150 to 100 in parts by weight. When the ratio is less than 10, the normal properties of the polyamide-imide resin present themselves without being modified, that is, the linear expansion coefficient in the temperature range from glass transition point to 350° C. is large and the storage elastic modulus at 300° C. is low. When the ratio exceeds 150 parts by weight, compatibility of the thermosetting component with the resin composition lowers to cause gelation when stirred or reduction of flexibility and/or handling qualities of the produced film.

A wire scribed circuit board, a multilayer printed circuit board and a circuit board for chip carrier of the present invention using the above-described heat resistant resin adhesive composition and the processes for producing these circuit boards are described below.

[Wire scribed circuit board]

A wire scribed circuit board according to the present invention comprises an insulating substrate having conductor circuit thereon, an insulating adhesive layer formed thereon, a plurality of wires having an insulating coating and fixed in said insulating adhesive layer, and a plurality of plated through holes formed in portions necessary for electrical connection, said insulating adhesive layer having a storage elastic modulus at 300° C. of 30 MPa or more and a glass transition temperature of 180° C. or higher when cured, and made from an adhesive composition comprising a polyamide-imide resin and a thermosetting component.

The adhesive composition for forming the adhesive layer in the wire scribed circuit boards according to the present invention is preferably the one whose softening point in B-stage is 20 to 100° C. and glass transition point in the cured form is 180° C. or higher, preferably a composition whose thermal expansion coefficient in the temperature range from glass transition point to 350° C. is 1,000 ppm/° C. or lower and lowest elastic modulus at 300° C. is 30 MPa or more.

In case the softening point of the adhesive composition in B-stage exceeds 100° C., peeling tends to take place due to insufficient adhesive force when the wires having an insulating coating are scribed. In case the softening point is lower than 20° C., the handling characteristics of the adhesive composition tend to deteriorate because of tackiness of the composition.

Further, when the glass transition point of the adhesive composition in the cured form is lower than 180° C., or when the thermal expansion coefficient of the composition in the temperature range from glass transition point to 350° C. exceeds 1,000 ppm/° C. or when the lowest elastic modulus of the composition at 300° C. is less than 30 MPa, the wire scribed circuit board manufactured by using this adhesive composition proves low in solder heat resistance.

The wire scribed circuit board according to the present invention can be produced from a process comprising the steps of forming an insulating adhesive layer on an insulating substrate having conductor circuit thereon by coating said adhesive composition on the insulating substrate or by transferring the adhesive composition previously coated on a carrier film; scribing a plurality of wires having an insulating coating on said insulating adhesive layer and fixing the wires therein; subjecting the resulting insulating substrate to heat pressing to cure the adhesive composition; drilling holes in portions necessary for electrical connection, followed by plating on inner walls of the holes; and forming conductor circuits. The heat pressed substrate may be further subjected to a heat treatment.

A process for producing the wire scribed circuit board using said adhesive composition is explained in detail with reference to FIGS. 1A to 1H.

FIG. 1A illustrates conductor circuits (interlayer copper circuits 2) for power source, ground, etc., which have been provided on an insulating substrate 1. These circuits can be formed by working a glass-cloth reinforced copper-clad epoxy resin laminate or a glass-cloth reinforced copper-clad polyimide resin laminate by a known method such as etching. If necessary these interlayer circuits may be provided in multiple layers, or no such interlayer circuit may be provided at all.

Figure 1B:
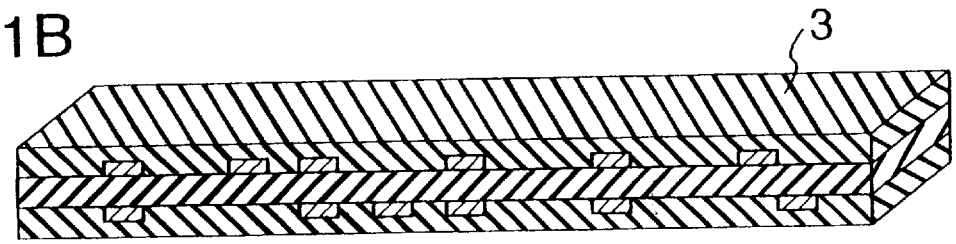

FIG. 1B illustrates formation of an insulating layer which serves as an underlay layer 3. These underlay layers are provided for improving corrosion resistance or adjusting specific impedance of the board, but they are not always necessary. Usually B-stage prepregs of glass-cloth reinforced epoxy or polyimide resins or B-stage resin sheets having no glass cloth reinforcement are used for said underlay layers.

These resin layers, after laminated on the substrate, are cured as required by a heat treatment or laminating.

Figure 1C:
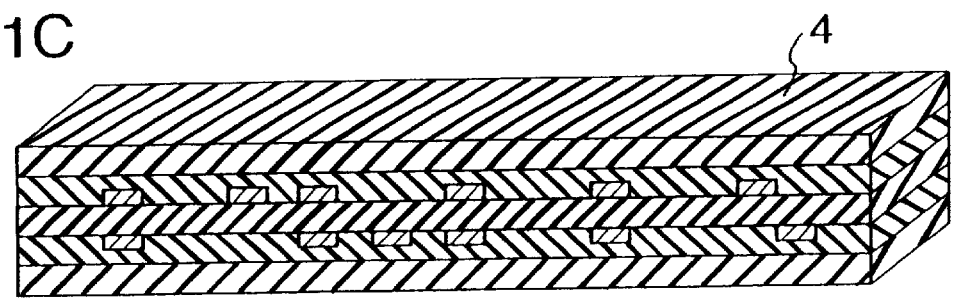

Then, as shown in FIG. 1C, the adhesive layers 4 are formed with said adhesive composition for facilitating scribing of the wires having an insulating coating and fixing thereof. These adhesive layers 4 may be formed by a method in which said adhesive composition is directly coated on the insulating substrate by a suitable coating means such as spray coating, roll coating or screen printing, followed by drying. This method, however, is unadvisable because of its tendency to cause nonuniform layer thickness or nonuniformity of specific impedance of the produced wiring board. For forming the adhesive layers with uniform thickness, it is preferable to use a method in which said adhesive composition is once roll coated on a carrier film such as a polypropylene film or a polyethylene terephthalate film and dried to form a dry film, and then this film is hot roll laminated or press laminated on the insulating substrate. Such a coating film forming an adhesive layer is required to have enough flexibility to be capable of being rolled up or cutting to a desired size and a non-tackiness enough to inhibit entrance of air cells when the adhesive layer is laminated on the substrate.

Figure 1D:
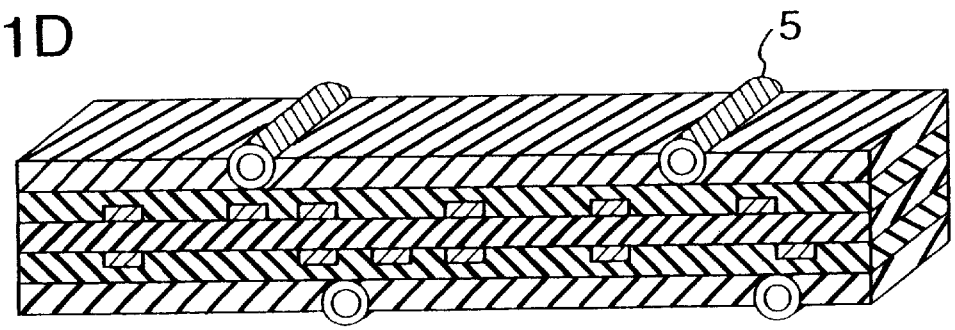

Then the wires 5 having an insulating coating are scribed as shown in FIG. 1D. This wire scribing is usually carried out by heating the laminate while giving ultrasonic vibrations by a wiring machine. The adhesive layer is softened, allowing the wires to be embedded therein. It should be noted, however, that if the softening point of the adhesive layer is too low, the wires having an insulating coating may be stripped off the adhesive layer at the ends, or the wires may be warped at the corners where the wires are bent at right angles, making it unable to obtain the desired precision.

On the other hand, if the softening point of the adhesive layer is too high, the wires may fail to be embedded properly, resulting in unsatisfactory adhesion between the wires and the adhesive layer, which may cause separation of wires or a positional deviation of the wires on the lower side as they are pushed by the wires on the upper side when they pass over the lower-side wires at crossovers. Therefore, it is necessary to control the softening point of the adhesive layer in an appropriate range during wire scribing.

The wires used for scribing in the present invention have an insulating coating so that there won't take place short-circuiting even when the wires are scribed intersecting each other on the same plane. The wire core is made of copper or a copper alloy and coated with a polyimide or the like. In order to enhance adhesion at the wire crossovers, an additional wire adhesive layer may be provided on the outside of the insulating coating. Such a wire adhesive layer may be made of a thermoplastic, thermosetting or photosetting type of material, but it is desirable to use a material having a composition of the same system as the adhesive described later.

Wire scribing is followed by heat pressing. This step is designed to reduce unevenness on the wired substrate surface and to remove the voids remaining in the adhesive layer. Voids in the adhesive layer are generated when the wires having an insulating coating are scribed with ultrasonic heating, or originate in the spaces formed around the crossovers of the wires, so that it is essential to flatten the heat pressed wired substrate surface and to remove the voids in the adhesive layer. Heat pressing is followed by a heat treatment to perfectly cure the adhesive layer. This heat treatment is not essential, however.

Figure 1E:
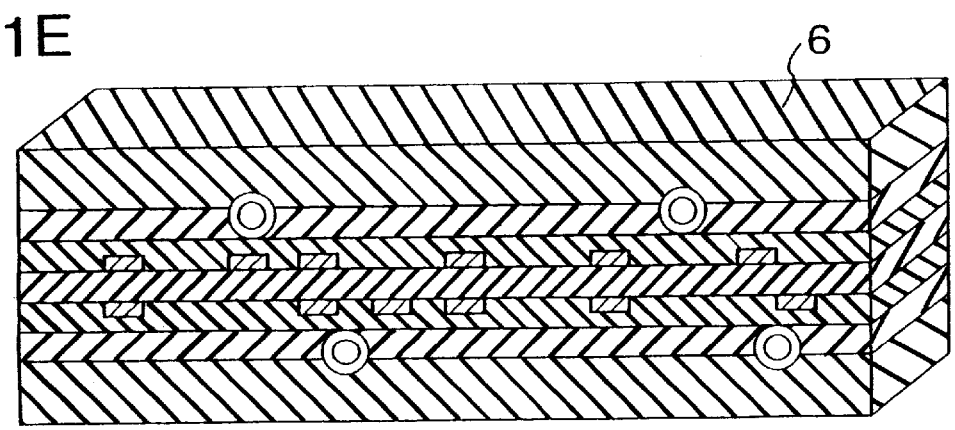

Next, the overlay layers 6 are provided for protecting the scribed wires as shown in FIG. 1E. These overlay layers 6 are usually made of a B-stage prepreg of a glass-cloth reinforced epoxy or polyimide resin, or a B-stage resin sheet containing no glass cloth reinforcement, and are finally cured.

Figure 1F:
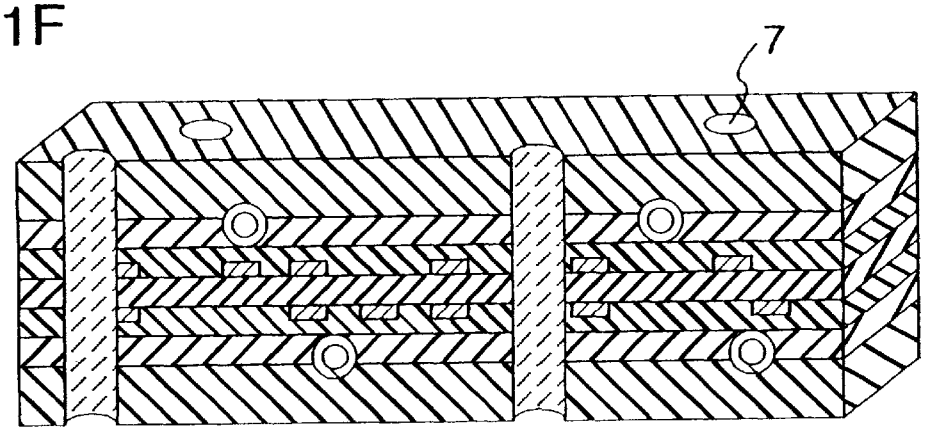
Figure 1G:
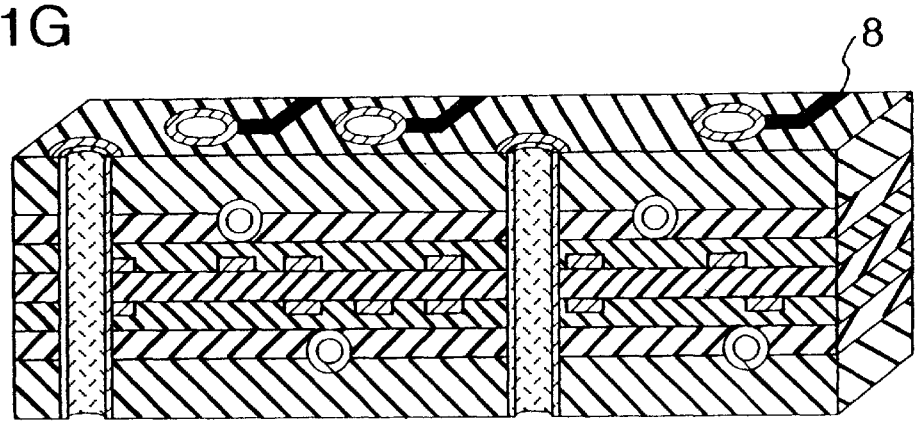

Then, drilling is conducted at the necessary portions to form via holes 7, followed by plating 8 as shown in FIGS. 1F and 1G. Here, prior to this drilling, a metal foil such as a copper foil may be attached to the surface via a prepreg in the course of formation of the overlay layer, followed by etching or other suitable working to form a circuit on the surface. A wire scribed circuit board having two wiring layers can be produced from the above process.

Figure 1H:
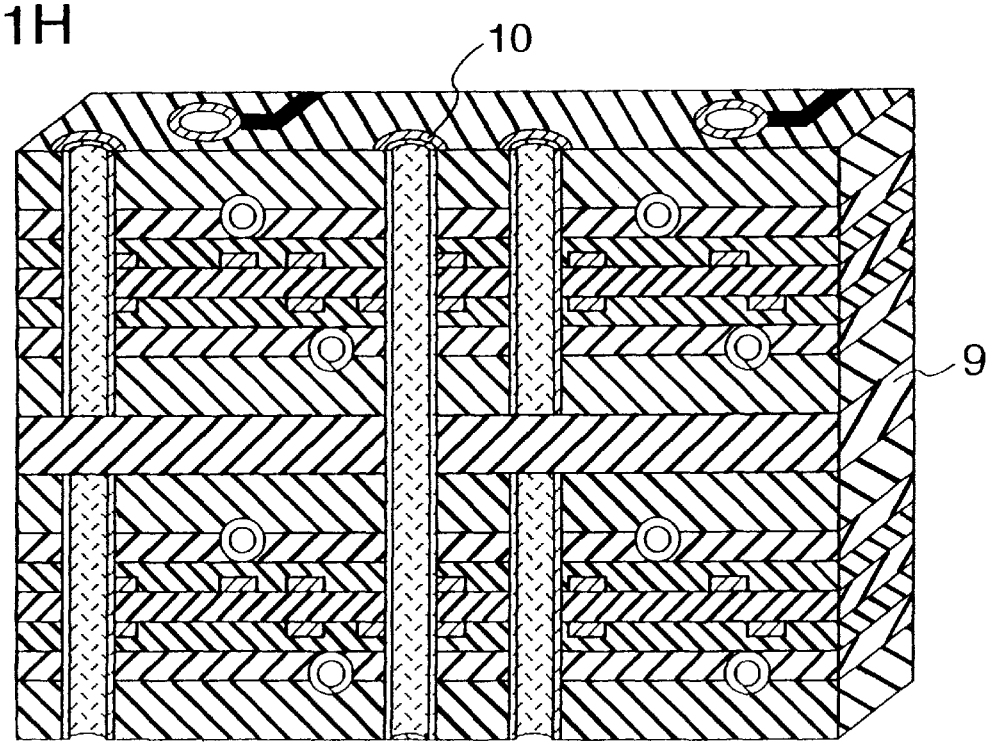

Two units of the thus produced wire scribed circuit board having two wiring layers are then laminated and bonded together, as shown in FIG. 1H, interposing therebetween an insulating layer 9 made of a B-stage prepreg of a glass-cloth reinforced epoxy or polyimide resin or a B-stage resin sheet containing no glass-cloth reinforcement. Then holes are formed at the necessary portions, followed by plating 10. The above process provides a wire scribed circuit board having four wiring layers. It is possible to obtain a wire scribed circuit board having 6 or more wiring layers by similarly laminating and bonding together 3 or more units of said wire scribed circuit board having two wiring layers. If necessary, a circuit-formed layer may be interposed between the adjoining units of wire scribed circuit board having two wiring layers.

Figure 2:
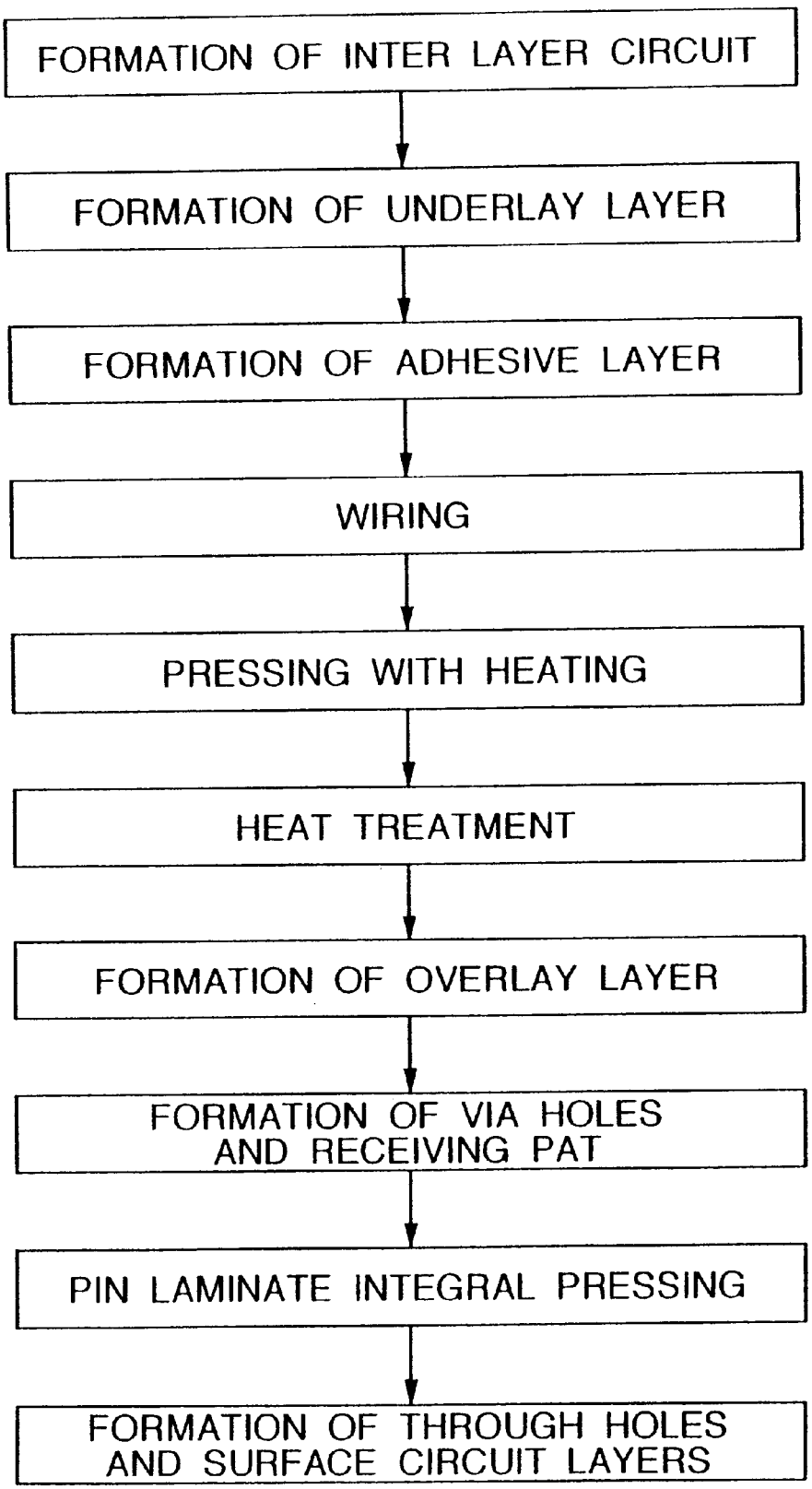
FIG. 2 is a flow chart of the wire scribed circuit board manufacturing process in an embodiment of the present invention.

FIG. 2 is a flow chart representation of the above-described process.

As explained above, by regulating the softening point of the B-stage adhesive composition to stay preferably in the range of 20 to 100° C., it is possible to keep high adhesion between the wire-holding adhesive layer and the adhesive on the substrate to better wiring and handling properties in high-density wiring.

Also, solder heat resistance of the wire scribed circuit boards using said adhesive composition can be improved by working the adhesive composition so that it will have a glass transition point of 180° C. or higher when cured, a thermal expansion coefficient of not greater than 1,000 ppm/° C. in the temperature range from glass transition point to 350° C., and an elastic modulus at 300° C. of 30 MPa or more.

In the wire scribed circuit board manufacturing process using a conventional UV-curing adhesive AS-U01 (a trade name, mfd. by Hitachi Chemical Co., Ltd.), wire swimming is controlled by causing a limited degree of curing after wire scribing and then conducting heat pressing. In contrast, in the case of the adhesive composition of the present invention, because of use of a polyamide-imide resin having a molecular weight of preferably not less than 80,000, the resin flow is small and there takes place almost no wire swimming even when heat pressing is conducted after wire scribing, so that it is possible to fix the wires having an insulating coating and to cure the adhesive composition by heat pressing.

Further, according to the present invention, it is possible to remove the bubbles generated in the adhesive layer or the voids formed near the wire crossovers in the process till the wire scribing step and to lessen the unevenness of the substrate surface by controlling the heat pressing temperature, pressure and time after wire scribing. Consequently, there can be produced a wire scribed circuit board with high connection reliability and having no bubbles or voids even after the overlay layers have been provided, as shown in FIG. 1E.

[Multilayer printed circuit board]

A multilayer printed circuit board according to the present invention comprises a plurality of insulating substrates having conductor circuits thereon, insulating adhesive layers interposed between these insulating substrates alternately, and a plurality of plated through holes electrically connecting conductor circuits, said insulating adhesive layer having a storage elastic modulus at 300° C. of 30 MPa or more and a glass transition temperature of 180° C. or higher, and made from an adhesive composition comprising a polyamide-imide resin and a thermosetting component.

In the multilayer printed circuit board according to the present invention, at least one layer of conductor circuits is formed on the surface of each insulating substrate with a heat resistant resin adhesive composition comprising a polyamide-imide resin and a thermosetting component, the cured product of said heat resistant resin adhesive composition having a glass transition temperature of 180° C. or higher, a linear expansion coefficient in the temperature range from the glass transition temperature to 350° C. of preferably not greater than 500 ppm/° C. and a storage elastic modulus at 300° C. of 30 MPa or more.

Such a multilayer printed circuit board can be produced from a process comprising the steps of:

(a) laminating a plurality of insulating substrates having conductor circuits thereon as interlayer substrates and copper foil outer layers interposing therebetween a plurality of insulating adhesive layers made from a thermosetting adhesive composition comprising a polyamide-imide resin and a thermosetting component, followed by bonding under pressure with heating, (b) drilling through holes at predetermined portions so as to expose conductor circuits on individual layers for electrical connection, (c) conducting plating so as to electrically connect the individual conductor circuits, (d) forming an etching resist on the outer layer copper foils and removing the copper foils selectively by etching to form wiring circuits, and (e) removing the etching resist; or a process comprising the steps of:

(a) laminating an interlayer substrate having conductor circuit thereon and an outer layer copper foil interposing therebetween an insulating adhesive layer made from an adhesive composition comprising a polyamide-imide resin and a thermosetting component, followed by bonding under pressure with heating, (b) forming an etching resist on the outer layer copper foil and removing the copper foil selectively by etching to form fine holes, (c) removing the etching resist, (d) removing a cured resin in the insulating adhesive layer exposed to the fine holes by laser drilling to form via holes and to expose the conductor circuit on the interlayer substrate, (e) conducting plating so as to electrically connect the conductor circuit on the interlayer substrate and the outer layer copper foil, (f) forming an etching resist on the outer layer copper foil and conducting selective etching to form a wiring circuit on the copper foil, and (g) removing the etching resist.

The steps (a) to (g) in the above process may be repeated a desired number of times and further a step (h) for forming via holes over two layers or more continuously may be added to increase the number of laminations.

A copper foil-containing adhesive film prepared by directly coating an adhesive material on a copper foil may be used in place of the adhesive layer and copper foil used in the step (a) in the above process.

A multilayer printed circuit board according to the present invention can also be produced by a process comprising the steps of:

(a1) laminating an interlayer substrate having conductor circuit thereon and an outer layer copper foil interposing therebetween an adhesive layer made from an adhesive composition comprising a polyamide-imide resin and a thermosetting component, followed by bonding under pressure with heating, (b1) forming an etching resist on the copper foil which becomes an outer layer temporarily and removing the temporary outer layer copper foil selectively by etching to form the fine holes, (c1) removing the etching resist, (d1) removing a cured resin in the insulating adhesive layer exposed to the fine holes by laser drilling to form via holes and to expose the conductor circuit on the interlayer substrate, (e1) conducting plating so as to electrically connect the conductor circuit on the interlayer substrate and the temporary outer layer copper foil, (f1) forming an etching resist on the temporary outer layer copper foil and conducting selective etching to form a wiring circuit, (g1) removing the etching resist, and if necessary, repeating the steps (a1) to (g1) a predetermined number of times, and (h) conducting the steps (a) to (g) of the above-described process using the obtained interlayer substrate in the step (a) to have via holes over two or more layers continuously.

In the present invention, when the glass transition temperature of the heat resistant resin adhesive composition in its cured form is less than 180° C. or when its linear expansion coefficient in the temperature range from the glass transition point to 350° C. exceeds 500 ppm/° C., there take place formation of voids and delamination due to the difference in contraction between the adhesive layer and the insulating substrate in the cooling step after heating for solder mounting. Also, when the storage elastic modulus at 300° C. of the adhesive layer is less than 30 MPa, the resin becomes fluid when heated and flows to an easily expandable portion, which tends to cause nonuniformity of the layer thickness or formation of voids by resin flow.

The heat resistant resin adhesive composition of the present invention comprises a polyamide-imide resin and a thermosetting component, and is capable of forming a thermosetting polyamide-imide adhesive layer.

In case a polyamide-imide resin alone is used for forming the adhesive layer, although the glass transition point of the layer is high (230–250° C.), its linear expansion coefficient in the temperature range from glass transition point to 350° C. becomes smaller than 500 ppm/° C. while the storage elastic modulus at 300° C. becomes lower than 30 MPa, so that when such a composition is used for making a wiring board, there occur formation of voids and/or delamination in the substrate after solder mounting of parts.

The resin flow of the B-stage thermosetting polyamide-imide adhesive layer is preferably not less than 500 $\mu$m. If it is less than 500 $\mu$m, there arise the problems relating to embedding of interlayer circuits and surface unevenness.

In the present invention, the term "resin flow" signifies the distance through which the resin effused inwardly from a 1 cm-diameter hole formed in a 50 $\mu$m thick half-cured adhesive film when the adhesive film was superposed on a copper-clad laminate and bonded by heating at 200° C. under pressure of 40 kgf/cm$^2$ for 60 minutes.

"B-stage" means the intermediate stage in the curing reaction of the thermosetting resin.

The B-stage thermosetting polyamide-imide adhesive layer may be designed to have a multilayer structure of low flow/high flow, high flow/low flow/high flow or such pattern to satisfy both requirements for moldability and resin thickness. A copper foil-containing adhesive film made by directly coating an adhesive material on a copper foil may be used in place of said combination of an outer layer copper foil and a B-stage thermosetting polyamide-imide adhesive layer.

When a high flow (greater than 500 $\mu$m resin flow) type polyamide-imide adhesive film is used and laminated, resin can be embedded in IVH in a desired manner, so that the surface of the interlaminar insulating layer becomes relatively flat, inhibiting formation of unevenness of outer layer conductor circuits formed thereon. Because of the characteristic properties of the adhesive resin layer that its glass transition point is 180° C. or higher, that its linear expansion coefficient in the temperature range from glass transition point to 350° C. is not greater than 500 ppm/° C. and that its storage elastic modulus at 300° C. is 30 MPa or more, it is possible to control formation of voids and peeling of the layers at the time of solder mounting of components even in the portions with a high through hole density, and a multilayer printed circuit board with high heat resistance and connection reliability can be obtained.

[Circuit board for chip carrier]

A circuit board for chip carrier according to the present invention comprises a plurality of insulating layers, a plurality of interlayer substrates having conductor circuits on individual insulating substrates, a plurality of insulating adhesive layers, each insulating adhesive layer bonding each insulating layer and each interlayer substrate or each insulating layer, a plurality of through holes having conductors on inner wall surfaces thereof and electrically connected to the conductor circuits, and a cavity for housing at least one semiconductor chip, said insulating adhesive layers having a storage elastic modulus at 300° C. of 30 MPa or more and a glass transition temperature of 180° C. or higher, and made from an adhesive composition comprising a polyamide-imide resin and a thermosetting component.

Figure 6:
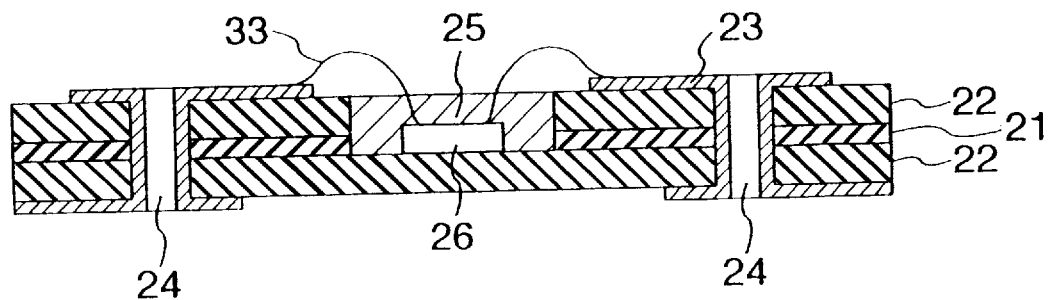
FIG. 6 is a schematic sectional view illustrating a mode of use of a circuit board for chip carrier according to the present invention.

Such a wiring board for chip carrier, as for instance illustrated in FIG. 6, comprises a plurality of insulating layers 22, a plurality of conductor circuit layers having conductor circuits 23 on the individual insulating layers 22, a plurality of insulating adhesive layers 21 each of which bonds each insulating layer 22 and each conductor circuit layer or each insulating layer 22, a plurality of through holes 24 having conductors on the inner wall surfaces thereof and electrically connected to the conductor circuits 23, and a cavity 25 for housing at least one semiconductor chip 26, and is characterized in that the storage elastic modulus of the B-stage insulating adhesive layers 21 at 30° C. is preferably in the range of 1,000 to 5,000 MPa, that the storage elastic modulus of the C-stage insulating adhesive layers 21 at 300° C. is 30 MPa or more, and that the glass transition temperature of the insulating adhesive layers 21 is 180° C. or higher.

The above circuit board for chip carrier may have one or more via holes which electrically connect the neighboring interlayer substrates.

Also, in the above circuit board, the cavity may be so formed as to make smallest the space in the insulating layer nearest to the portion in which at least one semiconductor chip is to be fixed, and to make the spaces in overlaying insulating layers equal to each other or become larger progressively, and conductor circuits of individual interlayer substrates exposed to the cavity may have inner terminals for electrical connection to the semiconductor chips to be fixed.

The cavity may be a through hole, and at one opening of said through hole may be provided a heat sink designed to close the opening.

The outer terminals for making electrical connection to other circuit boards may be provided on the outermost insulating layer. Also, the outer terminal may consist of a plurality of pins, or it may be a land for making electrical connection by solder balls.

Such a circuit board for chip carrier can be produced by a process comprising the steps of laminating a plurality of insulating layers and a plurality of interlayer substrates having conductor circuits 23 on individual insulating substrates, interposing a plurality of insulating adhesive layers 21 between each insulating layer and each inter layer substrate or each insulating layer, while forming a cavity 25 for housing at least one semiconductor chip 26, and bonding under pressure with heating; drilling through holes 24 in the resulting laminate; and forming conductors on the inner wall surfaces of the through holes, said conductors being electrically connected to the conductor circuits 23, wherein preferably said insulating adhesive layers 21 have a B-stage storage elastic modulus at 30° C. of 1,000 to 5,000 MPa, a C-stage storage elastic modulus at 300° C. of 30 MPa or more, and a glass transition temperature of 180° C. or higher.

In the above process, a step of forming one or more via holes for making electrical connection between at least the neighboring conductor circuits may be added to the step of laminating the insulating layers and interlayer substrates, with the insulating adhesive layers being interposed therebetween, while forming a cavity for housing semiconductor chip(s), and bonding under pressure with heating.

Also, in the above process, the laminating step may comprises piling a copper-clad laminate having a cavity for housing a semiconductor chip and holes which are to become via holes on a conductor circuit formed on an interlayer substrate having the same cavity for housing a semiconductor chip as the copper-clad laminate via an insulating adhesive layer having the same holes to become via holes as the copper-clad laminate; bonding under pressure with heating to form a laminate; metallizing inner walls of via holes by copper plating, followed by removal of unnecessary copper by etching; piling a copper-clad laminate having a cavity for housing a semiconductor chip and holes to become via holes on the resulting laminate via an insulating adhesive layer having the same cavity for housing a semiconductor chip and the same holes to become via holes as the copper-clad laminate; and repeating the above steps for a predetermined number of times.

It is possible to use an interlayer substrate having one or more holes, which are to become via holes, whose inner walls have already been metallized.

The cavity provided for housing a semiconductor chip or chips by hollowing the insulating adhesive layers and the interlayer substrates may be so formed that the space in the insulating layer nearest to the portion in which at least one semiconductor chip is to be fixed will become smallest, and the spaces in overlaying insulating layers will become equal to each other or become larger progressively.

The above process may comprise the steps of: laminating a plurality of insulating layers and a plurality of interlayer substrates having conductor circuits on individual insulating substrates, inter- posing a plurality of insulating adhesive layers between each insulating layer and each interlayer substrate or each insulating layer, all of said insulating layers, said interlayer substrates and said insulating adhesive layers having the same space for a cavity for housing at least one semiconductor chip, followed by pressing with heating; drilling holes which become through holes in the resulting laminate; forming a conductor on the inner wall surfaces of said holes for electrical connection to conductor circuits; and forming a heat sink in an opening of the through hole so as to close the opening.

Unevenness or relief form may be formed at the brim portion of the heat sink in contact with the laminate.

In the above process, in the laminating step comprising placing a plurality of insulating layers and interlayer substrates while forming a cavity for housing at least one semiconductor chip, followed by pressing with heating, the laminate may have a structure of: press flat pannel/film-like material for protecting the product surface/a pile of insulating adhesive layers and interlayer substrates/cushioning material/molded product having a cavity hole/press flat pannel, which are heat pressed for integral lamination.

As described above, the insulating adhesive layers used in the present invention preferably have a B-stage storage elastic modulus at 30° C. of 1,000 to 5,000 MPa, a C-stage storage elastic modulus at 300° C. of 30 MPa or more, and a glass transition temperature of 180° C. or higher. When the B-stage elasticity at 30° C. is less than 1,000 MPa, the resin flow is large, which tends to cause seepage of the resin into the cavity, and when the elasticity exceeds 5,000 MPa, filling of the interlayer conductor circuits may become insufficient and also handling properties may be deteriorated. When the C-stage storage elastic modulus at 300° C. is less than 30 MPa or the glass transition temperature is lower than 180° C., the connection reliability and solder heat resistance may lower due to large resin flow or the difference in glass transition temperature from the insulating layers 22.

As the interlayer substrate of the wiring boards for chip carrier according to the present invention, there can be used the one obtained by etching away the unnecessary copper foil of a copper-clad laminate used for the ordinary wiring boards.

The insulating layers 22 in the copper-clad laminate may be composed of a thermosetting resin such as epoxy resin, phenol resin, polyimide resin or polyamide resin, a material obtained by impregnating said resin in reinforcing fiber such as glass cloth, glass paper, aramide paper or the like, or a material obtained by mixing said reinforcing fiber, glass chopped strand, short resin fiber, ceramic fiber, whiskers or other reinforcing fiber in said resin.

As the copper foil of said copper-clad laminate, there can be used, beside the ordinary rolled copper foil and electrolytic copper foil, a composite metal foil consisting of a thin copper foil and a carrier metal supporting it. Such composite metal foils include those produced by bonding a copper foil to an aluminum foil which has been subjected to a releasing treatment and those used as a stopper for etching, obtained by providing an etchable metal layer different from copper as the intermediate layer, for example, a composite film having a thin copper layer/nickel layer/thick copper layer structure.

The interlayer substrates used in the present invention may be the ones in which the copper foil at the unnecessary portions has been removed by etching as described above, or the ones in which via holes have already been formed.

For instance, in the manner of manufacturing an ordinary double sided wiring board, a both-side copper-clad laminated is drilled to form holes which are to become via holes, and conductors are formed on at least the inner walls of the holes, followed by removal of unnecessary copper by etching to make an interlayer substrate having wiring conductors on both sides.

Also, a copper-clad laminate having holes to become via holes may be placed on an interlayer substrate having conductor circuits with an insulating adhesive layer interposed therebetween, followed by pressing with heating for integral lamination, then copper plating is carried out to metallize the inner walls of the via holes, and unnecessary copper is removed by etching.

Another copper-clad laminate having holes to become via holes may be further placed thereon interposing an insulating adhesive layer therebetween, followed by pressing with heating for integral lamination, copper plating to metallize the inner walls of the via holes and removal of unnecessary copper by etching, the above steps being repeated a desired number of times to provide a required number of conductor circuit layers.

Alternatively, laminating step of the process of the present invention can be carried out by piling a copper-clad laminate having a cavity for housing a semiconductor chip and holes to become via holes on a conductor circuit formed on an interlayer substrate having the same cavity for housing a semiconductor chip as the copper-clad laminate via an insulating adhesive layer having the holes to become via holes; bonding under pressure with heating to form a laminate; metallizing inner walls of the via holes by copper plating, followed by removal of unnecessary copper by etching; piling a copper-clad laminate having a cavity for housing a semiconductor chip and holes to become via holes on the resulting laminate via an insulating adhesive layer having the same cavity for housing a semiconductor chip and the same holes to become via holes as the copper-clad laminate; and repeating the above-mentioned steps for predetermined times.

Figure 7:
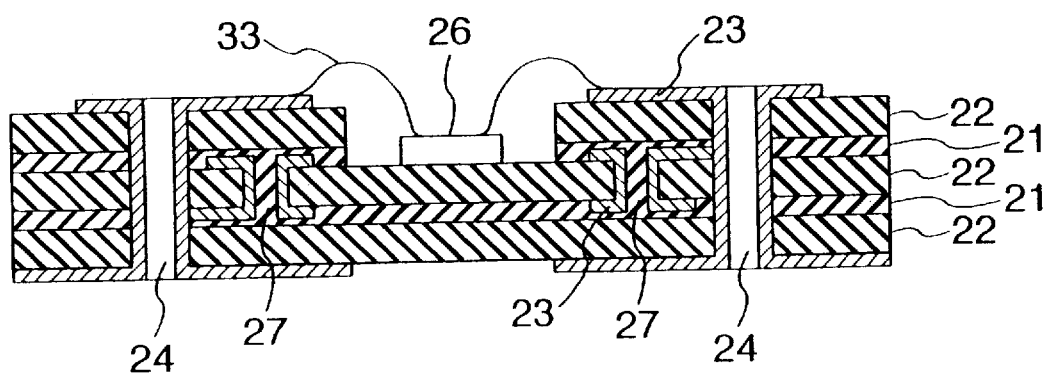
FIG. 7 is a schematic sectional view illustrating a first embodiment of circuit board for chip carrier according to the present invention.
Figure 8:
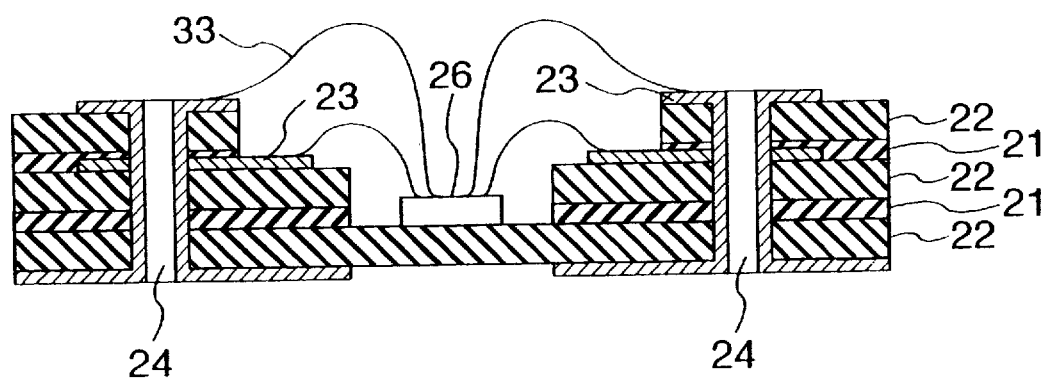
FIG. 8 is a schematic sectional view illustrating a second embodiment of circuit board for chip carrier according to the present invention.

The cavity 25, as illustrated in FIG. 7, is designed to form a space for mounting semiconductor chips 26. For connecting the semiconductor chips 26 to a wiring board for chip carrier, it needs to provide conductor circuits 23 serving as internal terminals on the wiring board side. It is to be noted that in case a large number of internal terminals need to be provided, a single layer of wiring may prove insufficient to accommodate all of these terminals. In the laminate of FIG. 7, via holes 27 may be formed. In case more wiring is needed, conductor circuits 23 designed to serve as internal terminals may be provided on a greater number of layers as shown in FIG. 8. In this case, the cavity is so formed that the space in the insulating layer 22 nearest to the portion where at least one semiconductor chip 26 is to be fixed will become smallest, and the spaces in overlaying insulating layers will become equal to each other or become larger progressively, and there may be provided on the insulating layers 22 the exposed conductor circuits 23 serving as internal terminals for making electrical connection to the semiconductor chips 26. Semiconductor chips 26 and conductor circuits 23 are connected by bonding wires 33.

Figure 9:
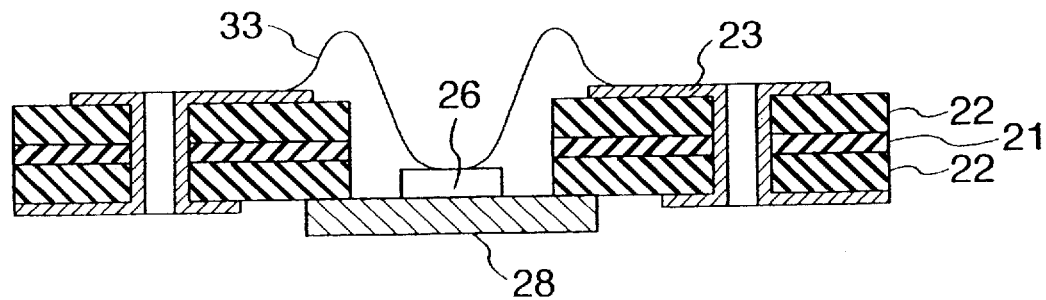
FIG. 9 is a schematic sectional view illustrating a third embodiment of circuit board for chip carrier according to the present invention.

The cavity 25 may be provided as a through hole, and as shown in FIG. 9, a heat sink 28 may be provided at an opening of the through hole so as to close the opening to make a wiring board with high heat dispersibility.

Figure 10:
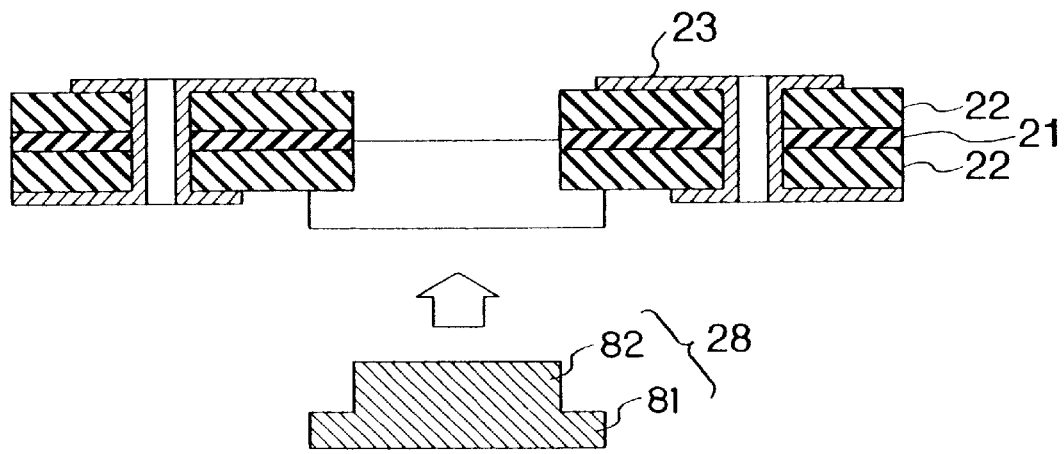
FIG. 10 is a schematic sectional view illustrating a fourth embodiment of circuit board for chip carrier according to the present invention.

In another embodiment of the invention, the heat sink 28, as shown in FIG. 10, comprises a support portion 81 for mounting semiconductor chips 26 and a brim portion 82 around the support portion, said brim portion being smaller in thickness than the support portion, and the outermost insulating layer is drilled to form a hole having almost the same size as the support portion 81 so that the support portion 81 of the heat sink 28 may be fitted in the hole.

Unevenness may be formed on the side of the brim portion 82 of the heat sink 28 to be bonded to the insulating layers 22 to enhance adhesion between the heat sink 28 and the circuit board for chip carrier.

Figure 11A:
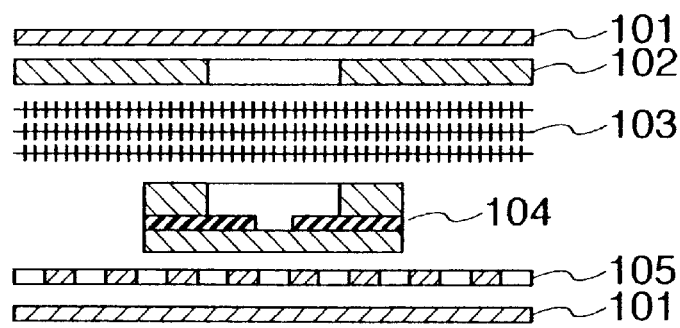
FIGS. 11A and 11B are schematic sectional views illustrating manufacture of the circuit board for chip carrier in an embodiment of the present invention.

In a method of forming the laminate structure of said circuit board for chip carrier, the component members are placed are placed one on the other, as shown in FIG. 11A, in the order of flat pannel/product surface protective film 105/pile 104 of insulating adhesive layers 21 and insulating substrates with insulating layers 22 interposed therebetween/cushioning material 103/molded product 102 having a cavity hole/flat pannel, followed by pressing with heating for integral lamination.

Figure 11B:
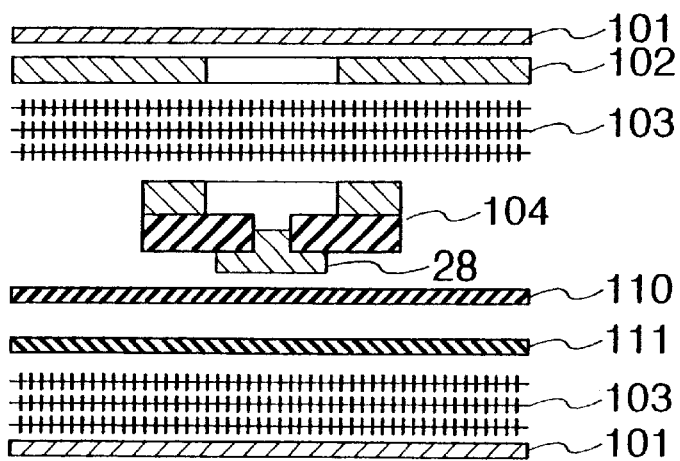

In case the heat sink 28 is bonded simultaneously, as shown in FIG. 11B, the laminate may be composed by placing the components in the order of flat pannel 101/cushioning material 103/film 111 with low melting point and large flow distance at the laminate heating temperature (such as polyethylene film)/product surface protecting film 110 with high melting point/pile 104 of insulating adhesive layers 21 and interlayer substrates with insulating layers 22 interposed therebetween/cushioning material 103/molded product 102 having a cavity hole/flat pannel 101.

Figure 12A:
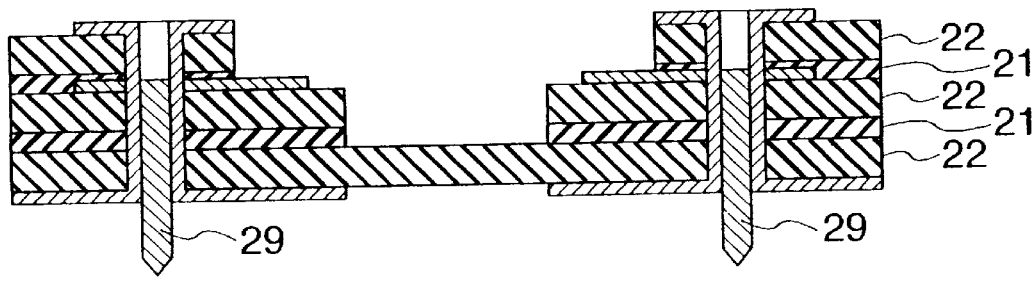
FIGS. 12A to 12C are schematic sectional views illustrating manufacture of the circuit board for chip carrier in another embodiment of the present invention.

In such a wiring board for chip carrier, there may be provided external terminals for electrical connection to other wiring boards. For instance, as shown in FIG. 12A, a pin grid array may be provided by using a plurality of pins 29.

Figure 12B:
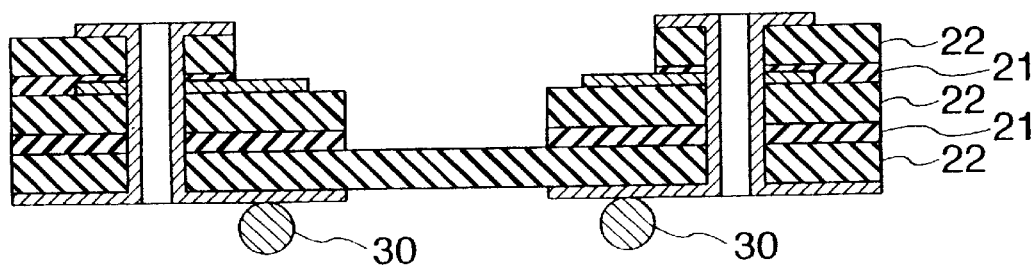

Also, a ball grid array may be provided by forming lands for making electrical connection with solder balls 30 as shown in FIG. 12B.

Figure 12C:
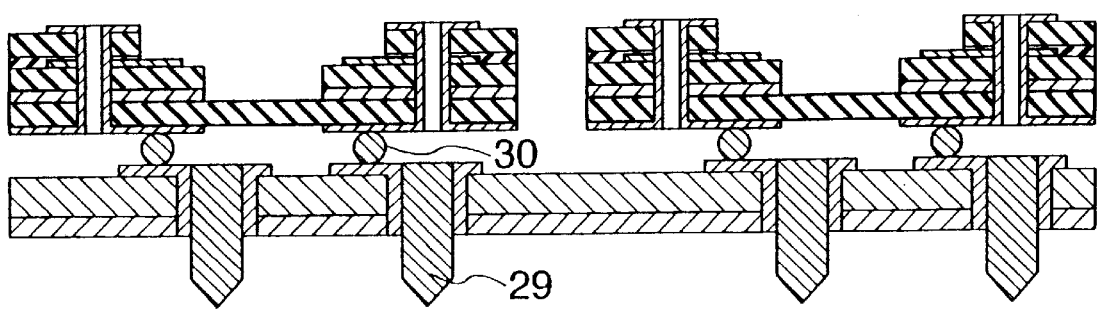

Further, the above mechanisms may be combined to provide a chip-on-chip wiring board or a multi-chip module as shown in FIG. 12C.

The present invention is explained in more detail by the following examples, but it should be recognized that the scope of the present invention is not restricted to these examples. The measured values shown in the Examples and Comparative Examples were determined by the following methods.

(1) Glass transition point (Tg)

This was determined by using TMA (a trade name, mfd. by Mac Science Inc.) under the following conditions:

Jig: pulling

Chuck interval: 15 mm

Measuring temperature: room temperature 350° C.

Heating rate: 10° C./min

Tensile load: 5 g

Sample size: 5 mm×30 mm (2) linear expansion coefficient

This was also determined by using TMA (a trade name, mfd. by Mac Science Inc.) under the following conditions:

Jig: pulling

Chuck interval: 15 mm

Measuring temperature: room temperature 350° C.

Heating rate: 10° C./min

Tensile load: 5 g

Sample size: 5 mm×30 mm (3) Storage elastic modulus

This was determined by using DVE-V4 (a trade name, mfd. by RHEOLOGY Co., Ltd.) under the following conditions:

Jig: pulling

Chuck interval: 20 mm

Measuring frequency: 5 Hz

Measuring temperature: room temperature 350° C.

Heating rate: 5° C./min

Sample size: 5 mm×30 mm (4) Surface circuit forming properties

This was evaluated by judging whether the line/space becomes 100 μm//100 μm or not.

(5) Solder heat resistance

The process of floating the wiring board in a 288° C. solder bath for 10 seconds and then cooling to normal temperature was repeated three times, and the resin layers in the board was observed to see whether there took place formation of voids or peeling of the layers.

EXAMPLES 1–16 AND COMPARATIVE EXAMPLES 1–11

(Wire scribed circuit boards)

(Adhesive varnish)

Two types of aromatic polyamide-imide resin, one with a molecular weight of about 100,000 (hereinafter referred to as PAI-1) and the other with a molecular weight of about 82,000 (hereinafter referred to as PAI-2), were selected, and other components were blended with these polyamide-imide resins in the ratios shown in Table 1 to prepare the adhesive varnishes.

The mechanical properties of the adhesive films obtained from these adhesive varnishes are also shown in Table 1.

TABLE 1

| | Adhesive composition | | | | | | | | Mechanical properties | | |
|---|---|---|---|---|---|---|---|---|---|---|---|
| | Resin | | | | Weight (g) | | | | | | |
| | | Thermosetting component | | | | | | | | | |
| Example No. | Polyamide-imide (PA1) | Epoxy (Ep) | Phenol (Ph) | Curing accelerator | PAI | Ep | Ph | Curing accelerator | Tg (° C.) | Thermal expansion coefficient at Tg-350° C. | Elastic modulus at 300° C. |
| Example | | | | | | | | | | | |
| 1 | PAI-1 | ESCN195 | H400 | — | 100.0 | 21.9 | 11.6 | 0 | 241 | 170 | 103 |
| 2 | | | | | 100.0 | 42.6 | 23.1 | | 207 | 130 | 179 |
| 3 | | ESCN195 | VH4170 | — | 100.0 | 21.8 | 12.5 | 0 | 243 | 166 | 116 |
| 4 | | | | | 100.0 | 42.6 | 24.9 | | 213 | 131 | 190 |
| 5 | | YD8125 | H400 | — | 100.0 | 38.6 | 23.1 | 0 | 217 | 196 | 43 |
| 6 | | | | | 100.0 | 77.3 | 46.0 | | 199 | 150 | 41.9 |
| 7 | | EOCN1020 | H400 | — | 100.0 | 21.7 | 11.6 | 0 | 250 | 193 | 32.6 |
| 8 | | | | | 100.0 | 13.4 | 23.0 | | 223 | 131 | 168 |
| 9 | | EOCN1020 | VH4170 | — | 100.0 | 21.7 | 12.4 | 0 | 258 | 206 | 31.5 |
| 10 | | | | | 100.0 | 43.4 | 24.8 | | 234 | 150 | 143 |
| 11 | | ESCN195 | — | 2E4MZ | 100.0 | 42.6 | — | 0.4 | 265 | 170 | 84.4 |
| 12 | | EOCN1020 | — | 2E4MZ | 100.0 | 43.5 | — | 0.4 | 265 | 169 | 99 |
| 13 | | EOCN1020 | KA1160 | — | 100.0 | 21.6 | 11.8 | 0 | 245 | 163 | 102 |
| 14 | | ESCN195 | KA1160 | — | 100.0 | 28.1 | 11.9 | | 242 | 159 | 110 |
| 15 | PAI-2 | ESCN195 | VH4170 | — | 100.0 | 24.4 | 14.1 | 0 | 270 | 180 | 37.1 |
| 16 | | | | | 100.0 | 48.6 | 28.7 | | 263 | 165 | 51.8 |
| Comp. Example | | | | | | | | | | | |
| 1 | PAI-1 | — | — | — | 100.0 | 0.0 | 0.0 | — | 250 | 5630 | 6.2 |
| 2 | | YD8126 | H400 | — | 100.0 | 19.3 | 11.6 | — | 266 | 270 | 18.8 |
| 3 | | ESCN195 | H400 | — | 100.0 | 101.3 | 64.8 | — | Incapable of forming a film | | |
| 4 | | EOCN1020 | H400 | — | 100.0 | 101.8 | 64.8 | — | Incapable of forming a film | | |
| 5 | | YD8126 | — | 2E4MZ | 100.0 | 8.4 | — | 0.1 | 248 | 1370 | 6.3 |

TABLE 1-continued

| | | Adhesive composition | | | | | | | | | |
|---|---|---|---|---|---|---|---|---|---|---|---|
| | | Resin | | | | | | | | | |
| | | Thermosetting component | | | Weight (g) | | | | Mechanical properties | | |
| Example No. | Polyamide-imide (PA1) | Epoxy (Ep) | Phenol (Ph) | Curing accelerator | PAI | Ep | Ph | Curing accelerator | Tg (° C.) | Thermal expansion coefficient at Tg-350° C. | Elastic modulus at 300° C. |
| 6 | — | YD8126 | — | 2E4MZ | 100.0 | 25.5 | — | 0.3 | 254 | 940 | 7.6 |
| 7 | — | ESCN195 | — | 2E4MZ | 100.0 | 9.6 | — | 0.1 | 262 | 306 | 18.7 |
| 8 | — | EOCN1020 | — | 2E4MZ | 100.0 | 8.9 | — | 0.1 | 262 | 244 | 29.3 |
| 9 | PAI-2 | — | — | — | 100.0 | 0.0 | 0.0 | — | 287 | 2580 | 13.9 |
| 10 | — | ESCN195 | VH4170 | — | 100.0 | 96.7 | 66.2 | — | Incapable of forming a film | | |
| 11 | AU-U01 | | | | | | | | 110 | | |

ESCN195: a trade name, mfd. by Sumitomo Chemical Co., Ltd.
EOCN1020: a trade name, mfd. by Nippon Kayaku Co., Ltd.
YD8125: a trade name, mfd. by Yuka Shell Epoxy Co., Ltd.
H400: a trade name, (imidazole), mfd. by Shikoku Kasei Kogyo K. K.
VH4170: a trade name (phenolic novolak), mfd. by Meiwa Plastic Industries, Ltd.
KA1160: a trade name (bisphenol A novolak), mfd. by Dainippon Ink and Chemicals Inc.
2E4MZ: a trade name (cresol novolak), md. by Dainippon Ink and Chemicals, Inc.

Using the above-mentioned adhesive varnishes, wire scribed circuit boards were manufactured in the following way.

(Adhesive coating)

Each of the adhesive varnishes of the compositions shown above was coated on a Tetoron film HSL-50 (a trade name, mfd. by Teijin Corp.) serving as a transfer base to a dry coating thickness of 50 μm and dried at 100° C. for 10 minutes to let the varnish assume a B-stage. The softening point of the varnish was 50° C.

(Substrate with adhesive coating)

Circuits were formed on a glass cloth-reinforced polyimide resin-made double-side copper-clad laminate MCL-I-671 (a trade name, mfd. by Hitachi Chemical Co., Ltd.) by normal etching. Then a glass cloth-reinforced polyimide resin prepreg GIA-671 (a trade name, mfd. by Hitachi Chemical Co., Ltd.) was applied on both sides of said substrate and cured by heat pressing to form the underlay layers, and then said adhesive was bonded to both sides of said substrate by heat pressing. Bonding could be effected by a hot roll laminator.

(Wire scribing)

Then the wires having an insulating coating HVE-IMW (a trade name, mfd. by Hitachi Densen K.K.) composed mainly of a high-molecular weight epoxy polymer were scribed on said substrate by a wire scribing machine under ultrasonic heating.

(Curing of adhesive layer)

The substrate was then subjected to heat pressing with a polyethylene sheet as cushion under the conditions of 150° C. and 16 kgf/cm$^2$ for 30 minutes, followed by heat treatment at 180° C. for 120 minutes to cure the adhesive layer.

(Formation of surface circuits)

A glass cloth-reinforced polyimide resin prepreg GIA-671(a trade name, mfd. by Hitachi Chemical Co., Ltd.) was applied on both sides of the substrate, and then an 18 μm thick copper foil was further applied thereon, these coatings being cured by heat pressing to form the surface circuit layers.

(Drilling/formation of via holes)

Holes were formed at the necessary portions of the substrate.

After formation of the holes, the substrate was subjected to pretreatments such as hole cleaning to remove smears and immersed in an electroless copper plating solution to provide a 30 μm thick deposit, followed by formation of surface circuits on one side by etching to make a wire scribed circuit board of a two-layer wiring structure.

(Manufacture of wire scribed circuit board of 4-layer wiring structure)

The surface circuit formed sides of the two wire scribed circuit boards of a two-layer wiring structure were placed on both sides of a glass cloth-reinforced polyimide resin prepreg GIA-671 (a trade name, mfd. by Hitachi Chemical Co., Ltd.) and cured by heat pressing to form the insulating layers, which was followed by making of holes, plating of the formed through holes and formation of surface circuits by etching to produce a wire scribed circuit board of a four-layer wiring structure.

(Solder heat resistance test)

Said wire scribed circuit board of a four-layer wiring structure was dried at 130° C. for 6 hours to perfectly eliminate moisture from the board. The board was cooled to normal temperature in a desiccator so that the board would not absorb moisture. Immediately there- after, the board was floated on a 288° C. solder bath for 10 seconds and then cooled to normal temperature. After repeating this operation three times, the condition of the board was observed.

EXAMPLE 17

(Wire scribed circuit board)

The procedure of Example 14 was followed except for use of phenoxy resin-made wire HAW-216C (a trade name, mfd. by Hitachi Densen K.K.).

The compositions used in Examples 1 to 17 showed a glass transition point (Tg) of 180° C. or higher, a thermal expansion coefficient in the temperature range from glass transition point to 350° C. of not greater than 1,000 ppm/° C. and an elastic modulus at 300° C. of 30 MPa or more. The wire scribed circuit boards made by using these compositions had no voids and suffered no peeling of layers even after the solder heat resistance test.

In contrast, in the case of the compositions used in Comparative Examples 1–10, those having a thermosetting component in excess of 150 parts by weight gelled when stirred and were incapable of forming a film (Comparative Examples 3, 4 and 10). The other compositions, although satisfactory in Tg, showed a thermal expansion coefficient at Tg of greater than 1,000 ppm/° C. and an elastic modulus at 300° C. of less than 30 MPa, and the wire scribed circuit boards made by using these compositions had voids in the adhesive layers or suffered peeling of the layers after the solder heat resistance test.

As described above, the wire scribed circuit boards of four or more wiring layers produced by using the adhesive compositions according to the present invention remain free of voids in the adhesive layers after wire scribing and fixing, and are very limited in movement of wires even when subjected to heat pressing after wire scribing and capable of high-density wiring.

They also have high solder heat resistance.

Production Example 1
(Synthesis of polyamide-imide resin)

123.2 g (0.3 mol) of 2,2-bis-[4-(4-aminophenoxy)phenyl] propane as a diamine having 3 or more aromatic rings, 115.3 g (0.6 mol) of trimellitic acid anhydride and 716 g of NMP (N-methyl-2-pyrrolidone) as a solvent were supplied into a one-liter separable flask provided with a cocked 25-ml fixed-quantity water receiver connected to a reflux condenser, a thermometer and a stirrer, and stirred at 80° C. for 30 minutes.

Then 143 g of toluene was added as an aromatic hydrocarbon capable of forming an azeotropic mixture with water, followed by a rise of temperature, and the mixture was refluxed at 160° C. for 2 hours.

After confirming that about 10.8 ml or a greater amount of water has been collected in the water receiver and that evaporation of water no longer took place, the temperature was raised to about 190° C. while removing the distillate collected in the water receiver, to remove toluene.

Thereafter, the solution was returned to room temperature and 75.1 g (0.3 mol) of 4,4'-diphenylmethane diisocyanate was supplied as an aromatic diisocyanate to carry out the reaction at 190° C. for 2 hours to obtain an NMP solution of an aromatic polyamide-imide resin.
(Adhesive composition)

To the above aromatic polyamide-imide resin were added an epoxy resin and a phenol resin as thermosetting component and stirred at normal temperature for about one hour to obtain an adhesive composition.
(Formation of B-stage film)

The above adhesive composition was coated on a release film and dried at 110° C. for 15 minutes to obtain an adhesive film with an about 50 μm dry coating thickness.

EXAMPLE 18
(Multilayer printed circuit board)

Figure 3A:
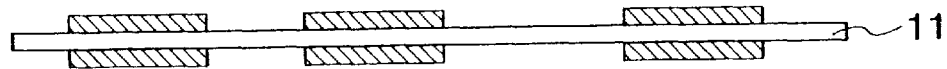
FIGS. 3A to 3D are schematic sectional views illustrating the sequential steps in the manufacture of a multilayer printed circuit board in an embodiment of the present invention.

An etching resist was formed on the surface of a copper-clad glass-reinforced epoxy laminate MCL-E-679 (a trade name, mfd. by Hitachi Chemical Co., Ltd.) having a substrate thickness of 0.2 mm and a copper foil thickness of 18 μm, and the copper portions exposed from the etching resist were removed by etching to make an interlayer substrate 11 as shown in FIG. 3A.

Figure 3B:
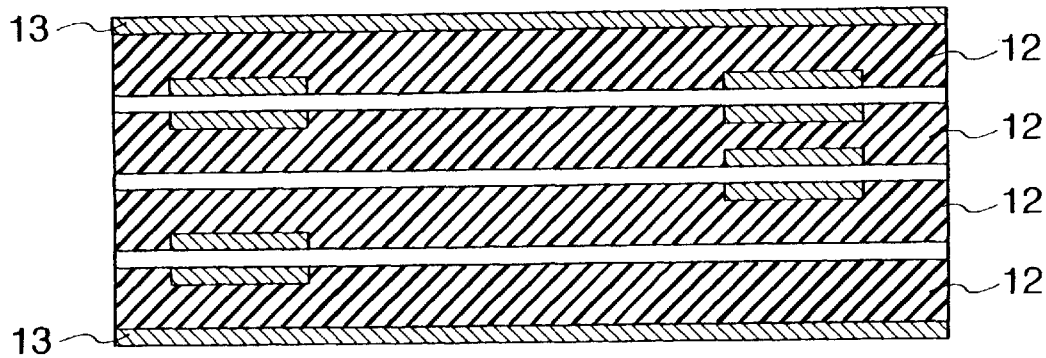

Then, as shown in FIG. 3B, the interlayer substrates 11 and the 18 μm thick outer layer copper foils 13 were laminated and bonded under the conditions of 180° C., 30 kgf/cm² and 60 minutes interposing therebetween a 50 μm thick B-stage polyamide-imide adhesive film 12 composed of 100 parts by weight of the aromatic polyamide-imide resin obtained in Production Example 1, 21.3 parts by weight of a cresol novolakepoxy resin ESCN195 (a trade name, mfd. by Sumitomo Chemical Industries Co., Ltd.) and 12.5 parts by weight of a bisphenol A phenol resin VH4170 (a trade name, mfd. by Dainippon Ink & Chemicals, Inc.), said adhesive film in the cured form having the following properties: glass transition point=241° C.; linear expansion coefficient in the temperature range from glass transition point to 350° C.=170 ppm/° C.; storage elastic modulus at 300° C. 103 MPa. The resin flow of this film was 800 μm.

Figure 3C:
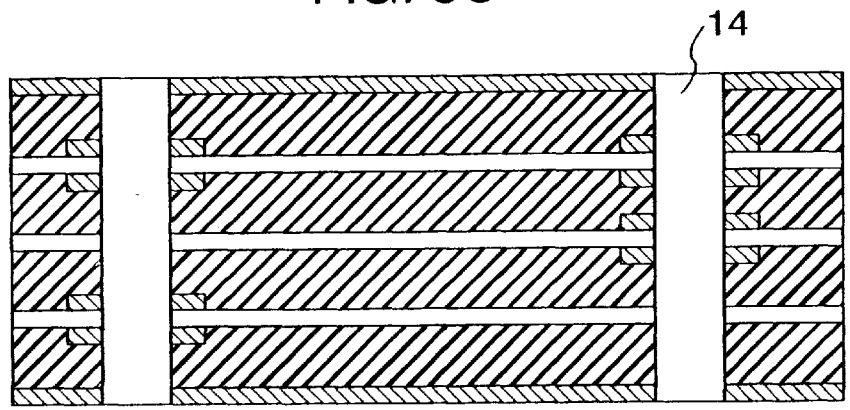

Then, the laminate was drilled to form through holes 14 at the desired positions as shown in FIG. 3C by using a 0.3 mm-bore drill.

Figure 3D:
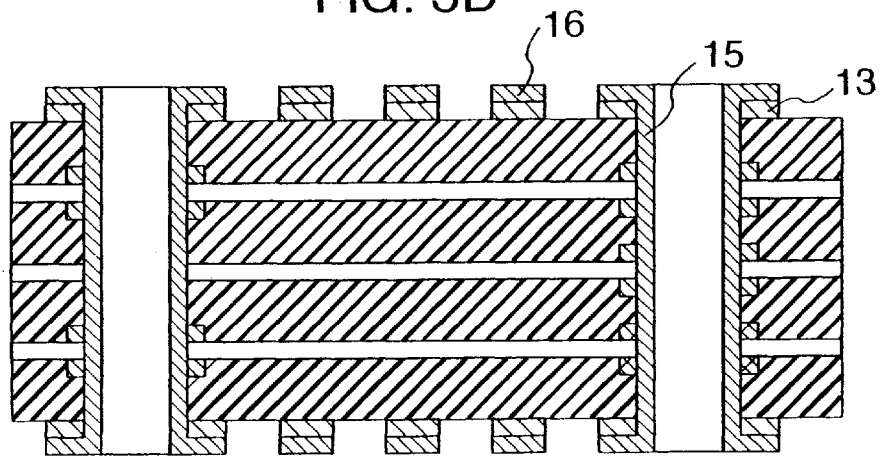

Next, as shown in FIG. 3D, approximately 15 μm thick electroless plating was carried out to form a metallic deposit 15 on the inner walls of the through holes 14, and the copper at the unnecessary portions of the surface was removed by etching to form wiring 16 at a density of line/space=100 μm/100 μm, thereby making a multilayer (8-layer) printed circuit board. This board showed excellent solder heat resistance.

EXAMPLE 19
(Multilayer printed circuit board)

Figure 4A:
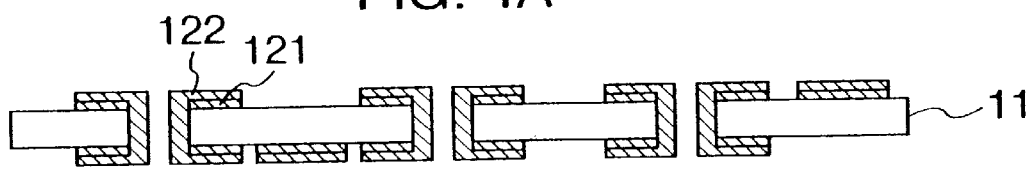
FIGS. 4A to 4I are schematic sectional views illustrating the sequential steps in the manufacture of a multilayer printed circuit board in another embodiment of the present invention.

A copper-clad glass-reinforced epoxy laminate MCL-E-679 (a trade name, mfd. by Hitachi Chemical Co., Ltd.) having a substrate thickness of 0.4 mm and a copper foil (121) thickness of 18 μm was drilled to form 0.3 mm-diameter holes at the predetermined positions, followed by approximately 12 μm thick electroless plating, then an etching resist was formed on the laminate surface and the copper portions exposed from the etching resist were removed by etching to make an interlayer substrate 11 as shown in FIG. 4A. In FIG. 4A, numeral 121 denotes a copper foil and numeral 122 is electroless plated layer.

Figure 4B:
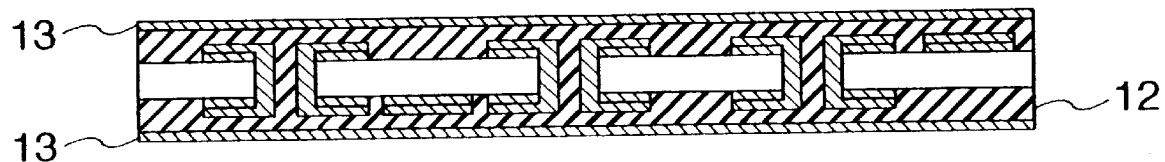

Then, as shown in FIG. 4B, the 50 μm thick B-stage polyamide-imide adhesive films 12 and the 18 μm thick outer layer copper foils 13, both being the same as used in Example 18, were laminated and bonded on both sides of the interlayer substrate 11 under the operating conditions of 180° C., 30 kgf/cm² and 60 minutes.

Figure 4C:
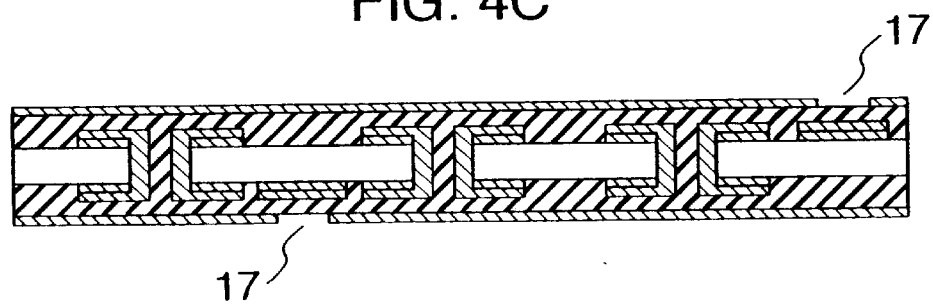

Then the portions of each outer layer copper foil 13 where via holes 19 were to be formed were etched away to form 100 μm openings 17 as shown in FIG. 4C.

Figure 4D:
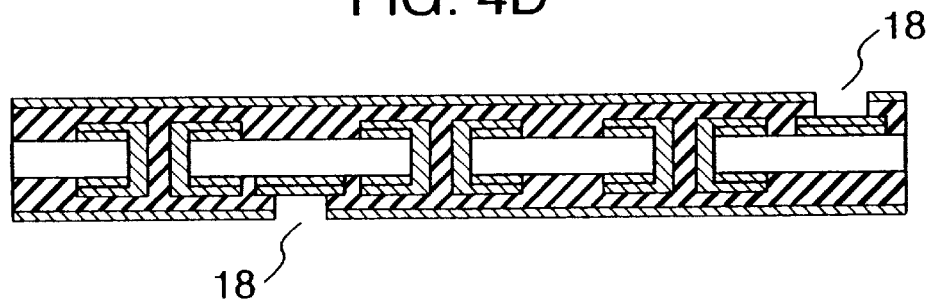

Next, as shown in FIG. 4D, the resin at the exposed portions where via holes 19 were to be formed was removed until the interlayer copper foil was exposed by using a laser drill GS-500H (a trade name, mfd. by Sumitomo Heavy Industries, Ltd.) under the conditions of:frequency=150 Hz; voltage=20 kV; pulse energy=85 mJ; number of shots=7.

Figure 4E:
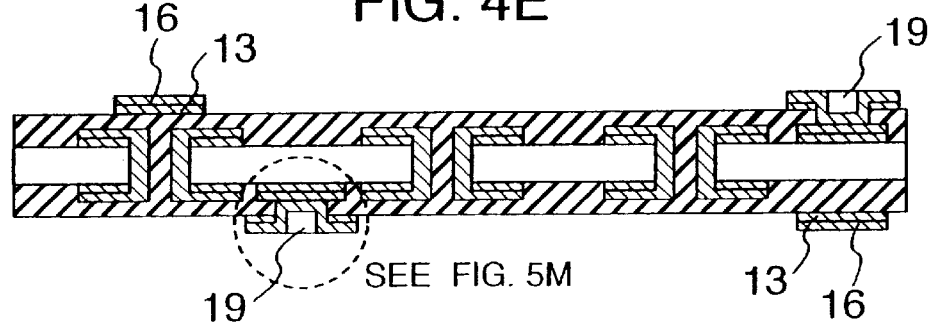

Then, as shown in FIG. 4E, electroless plating was carried out to a deposit (16) of approximately 15 μm and the outer layer copper foils and the interlayer circuits were electrically connected at via holes 19, after which copper at the unnecessary portions of the laminate surface was removed by etching to provide wiring at a density of line/space=100 μm/100 μm, thereby making a 4-layer built-up printed circuit board.

Figure 4F:
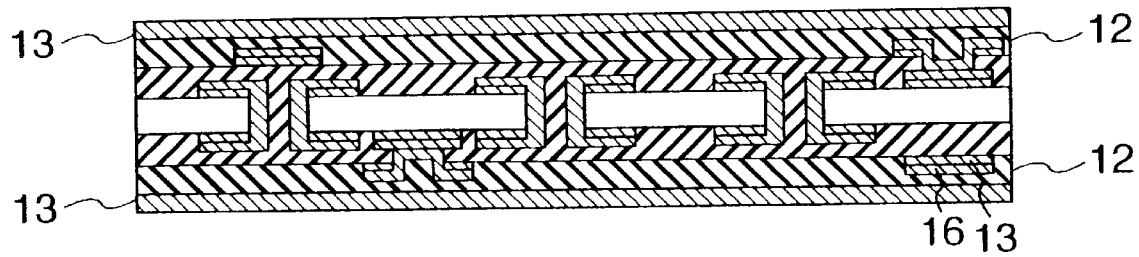

Then, as shown in FIG. 4F, the 50 μm thick B-stage polyamide-imide adhesive films 12 and the 18 μm thick outer layer copper foils 13, the same as used in Example 18, were laminated and bonded on both sides of the 4-layer built-up printed circuit board under the operating conditions of 180° C., 30 kgf/cm² and 60 minutes.

Figure 4G:
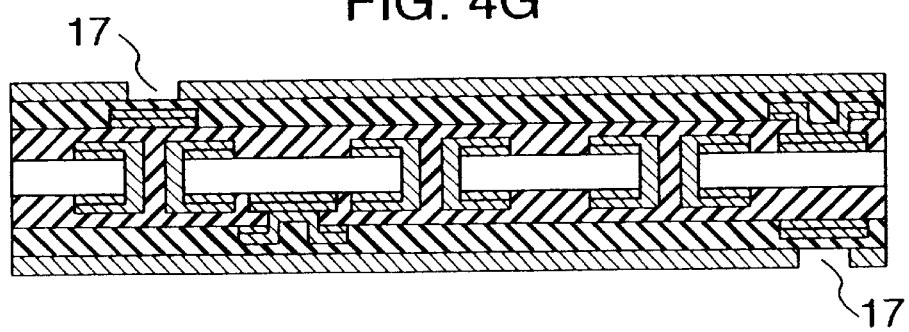

Then the portions of each outer layer copper foil 13 where via holes 19 were to be formed were removed by etching to form 100 μm openings 17 as shown in FIG. 4G.

Figure 4H:
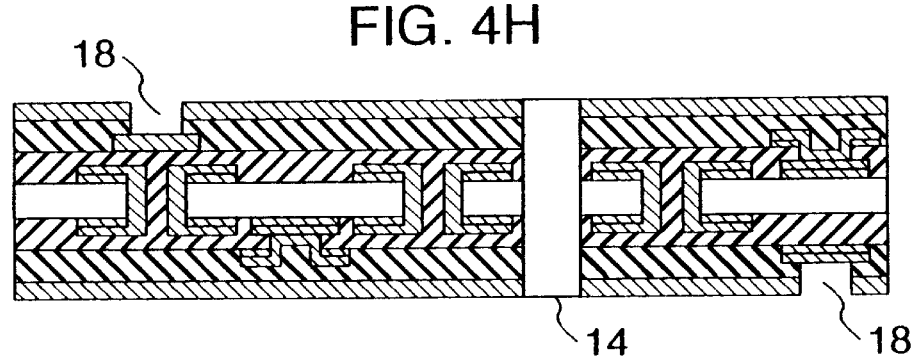

Next, the resin at the exposed portions where via holes were to be formed was removed until the interlayer copper foil was exposed by a laser drill GS-500H, and through holes 14 were further formed in the laminate by a 0.3 mm-bore drill as shown in FIG. 4H.

Figure 4I:
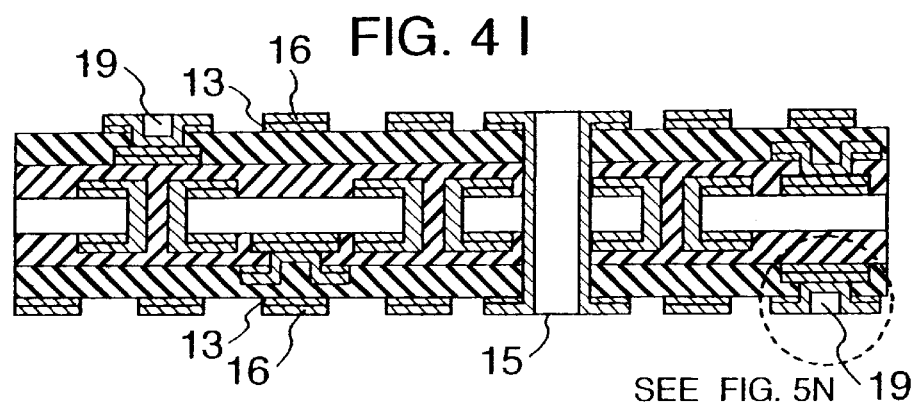

Then, as shown in FIG. 4I, 15 μm-deposit electroless plating was conducted, and after making interlayer electrical connections at through holes 15 and via holes 19, copper at the unnecessary portions of the laminate surface was removed by etching and wiring was formed at a density of line/space 100 μm/100 μm to make a 6-layer built-up printed circuit board.

Figure 5A:
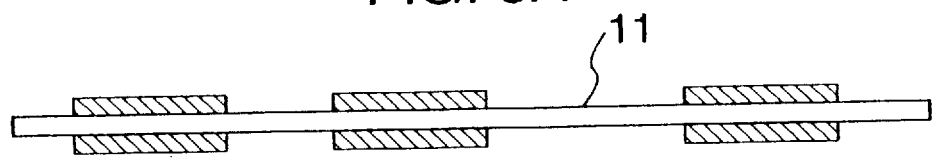
FIGS. 5A to 5L are schematic sectional views illustrating the sequential steps in the manufacture of a multilayer printed circuit board in still another embodiment of the present invention.
Figure 5B:
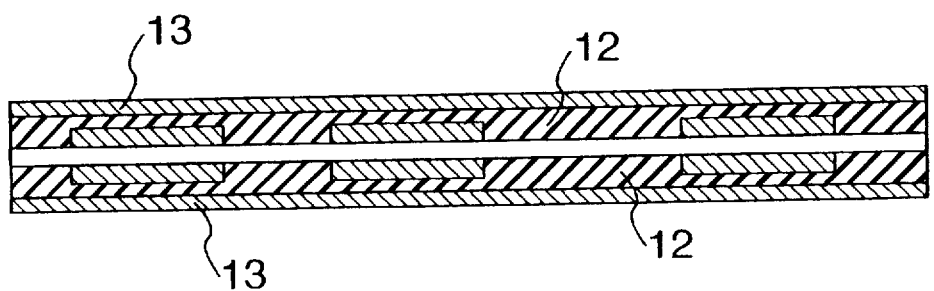
Figure 5C:
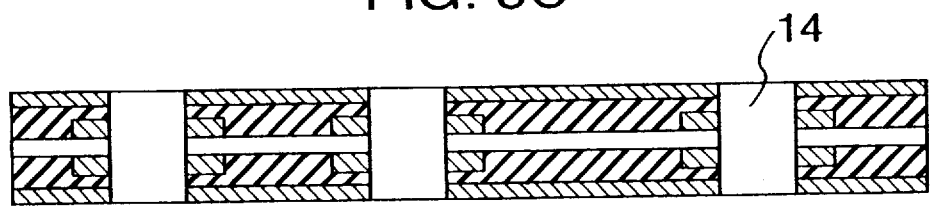
Figure 5D:
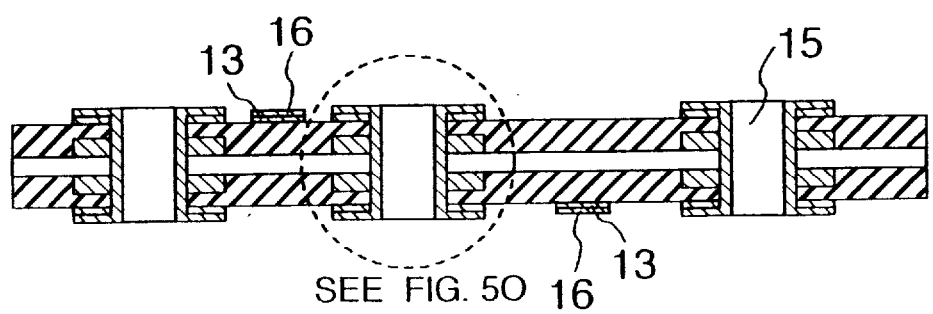
Figure 5E:
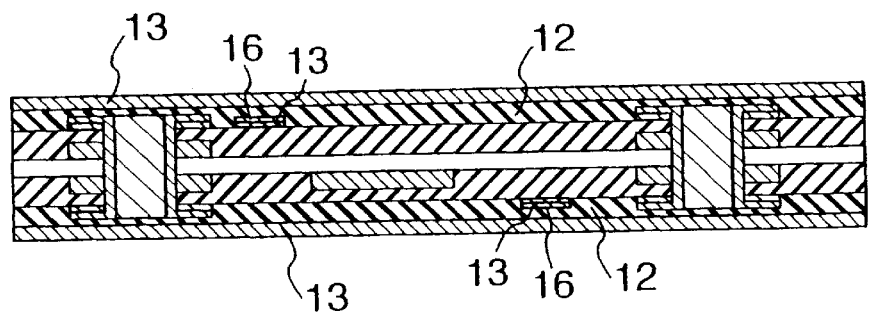
Figure 5F:
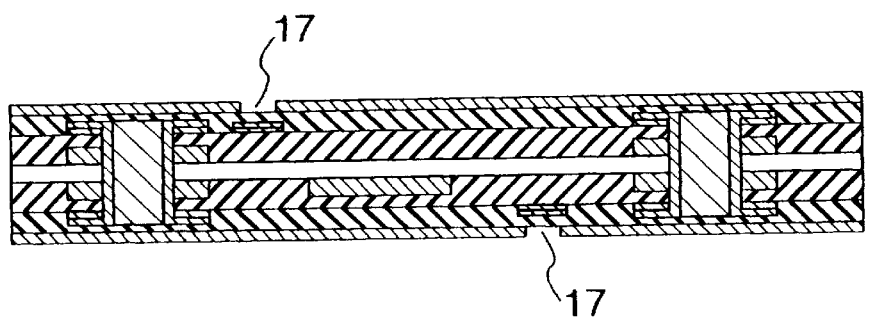
Figure 5G:
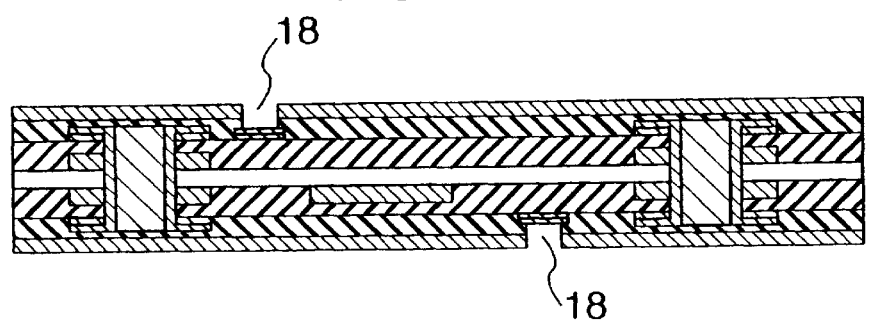
Figure 5H:
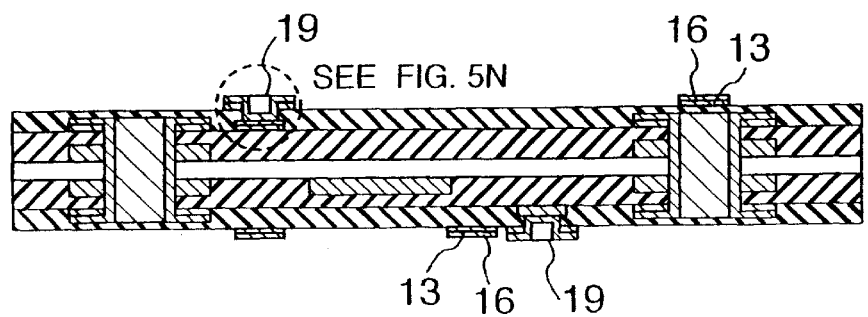
Figure 5I:
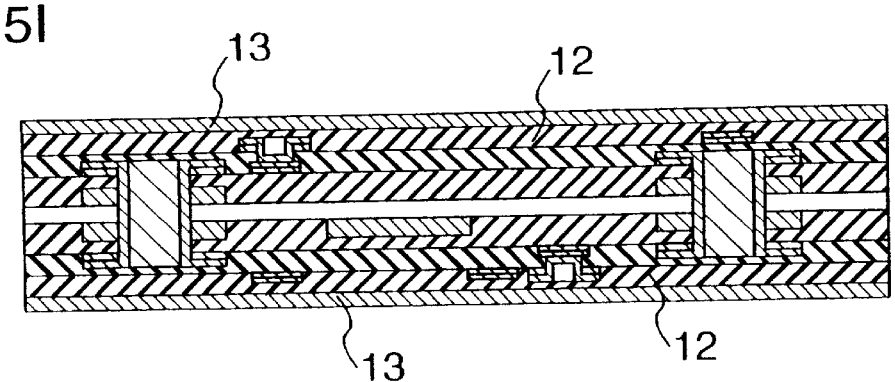
Figure 5J:
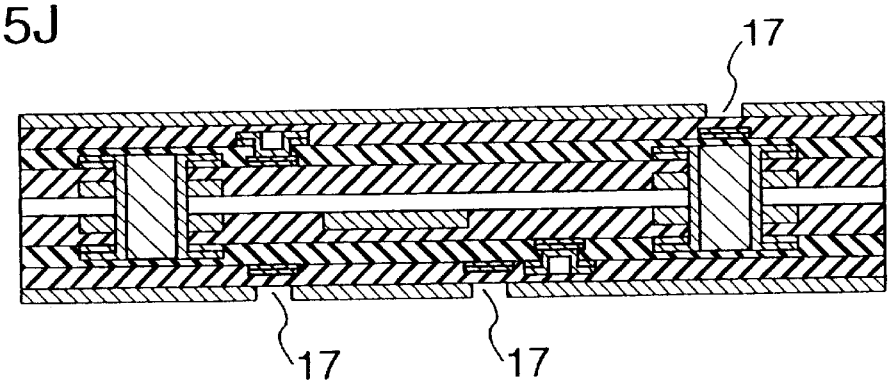
Figure 5K:
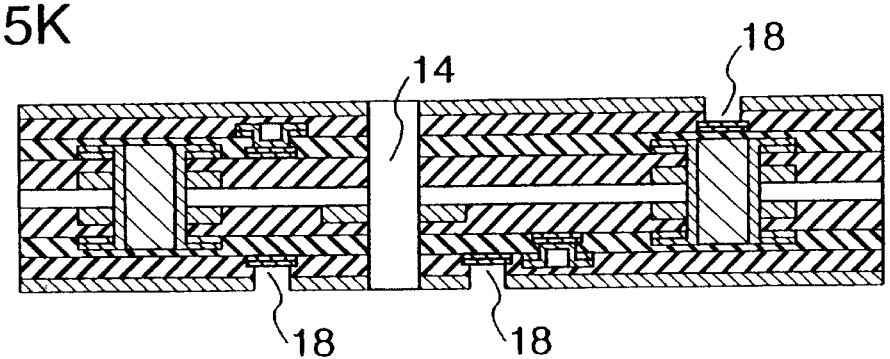
Figure 5L:
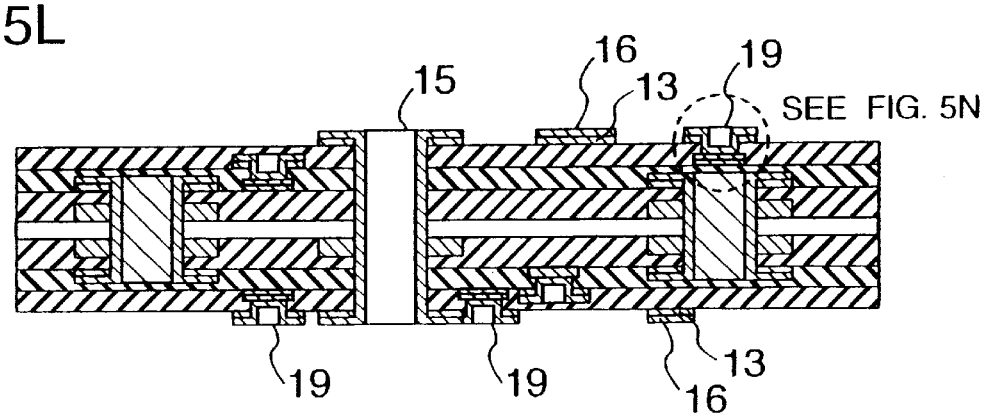
Figure 5M:
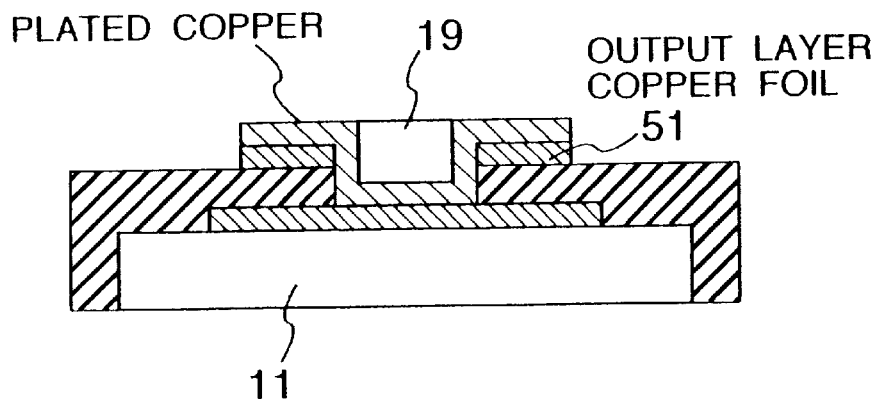
FIGS. 5M, 5N and 5O are partial enlarged views of FIGS. 4E, 4I, 5D, 5H and 5L, respectively.
Figure 5N:
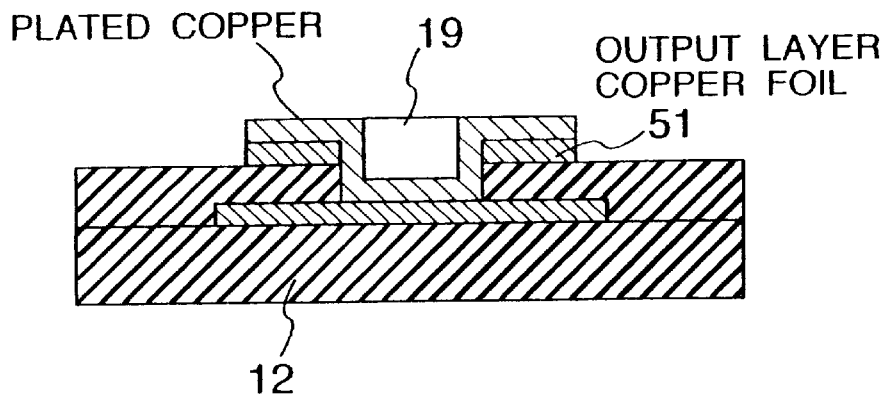

The encircled portion in FIG. 4E is shown enlarged in FIG. 5M, and the encircled portion in FIG. 4I is shown enlarged in FIG. 5N.

The obtained circuit board had excellent solder heat resistance.

EXAMPLE 20

(Multilayer printed circuit board)

An etching resist was formed on the surface of MCL-E-679 (a trade name, mfd. by Hitachi Chemical Co., Ltd.) having a substrate thickness of 0.2 mm and a copper foil thickness of 18 μm, and the copper portions exposed from the etching resist were removed by etching to make an interlayer substrate 11 as shown in FIG. 5A.

The 50 μm thick B-stage polyamide-imide films 12 and the 18 μm thick outer layer copper foils 13, the same as used in Example 18, were laminated and bonded on both sides of the interlayer substrate 11 under the operating conditions of 180° C., 30 kgf/cm² and 60 minutes as shown in FIG. 5B.

The laminate was drilled at the predetermined positions by a 0.3 mm-bore drill to form through holes 14 as shown in FIG. 5C.

Approximately 15 μm electroless plating was conducted to form a metallic deposit 15 on the inner walls of through holes 14 as shown in FIG. 5D, and the copper at the unnecessary portions of the surface was removed by etching to form wiring 16 on the copper foil 13 at a density of line/space=100 μm/100 μm, thereby making a four-layer printed circuit board.

The 50 μm thick B-stage polyamide-imide adhesive films 12 and the 18 μm thick outer layer copper foils 13, the same as used in Example 18, were laminated and bonded on both sides of the four-layer printed circuit board under the conditions of 180° C., 30 kgf/cm² and 60 minutes as shown in FIG. 5E.

The portions of each outer layer copper foil 13 where via holes 19 were to be formed were removed by etching to provide 100 μm openings 17 as shown in FIG. 5F.

The resin at the exposed portions where via holes 19 were to be formed was removed until the interlayer copper foil was exposed by a laser drill GS-500H as shown in FIG. 5G. Numeral 18 denotes the holes which become via holes.

Then approximately 15 μm electroless plating (16) was carried out and the outer layer copper foils and the interlayer circuits were electrically connected at via holes 19, after which the copper at the unnecessary portions of the surface was removed by etching to form wiring at a density of line/space=100 μm/100 μm, thereby making a 6-layer built-up printed circuit board as shown in FIG. 5H.

The B-stage polyamide-imide adhesive films 12 and the 18 μm outer layer copper foils 13, the same as used in Example 18, were laminated and bonded on both sides of the 6-layer built-up printed circuit board under the operating conditions of 180° C., 30 kgf/cm² and 60 minutes as shown in FIG. 5I.

The portions of each outer layer copper foil 13 where via holes 19 were to be formed were removed by etching to provide 100 μm openings 17 as shown in FIG. 5J.

The resin at the exposed portions where to form via holes 19 was removed until the interlayer copper foil was exposed by a laser drill GS-500H to form holes 18, and then the laminate was further perforated by a 0.3 mm-bore drill to form through holes 14 as shown in FIG. 5K.

Then 15 μm electroless plating (16) on the copper foil (13) was carried out, and after making interlayer electrical connections at via holes 19, the copper at the unnecessary portions of the surface was removed by etching to form wiring at a density of line/space=100 μm/100 μm, thereby making an 8-layer built-up printed circuit board as shown in FIG. 5L. In FIG. 5L, numeral 15 denotes plating and 16 denotes wiring.

This circuit board showed excellent solder heat resistance.

EXAMPLE 21

(Multilayer printed circuit board)

Figure 5O:
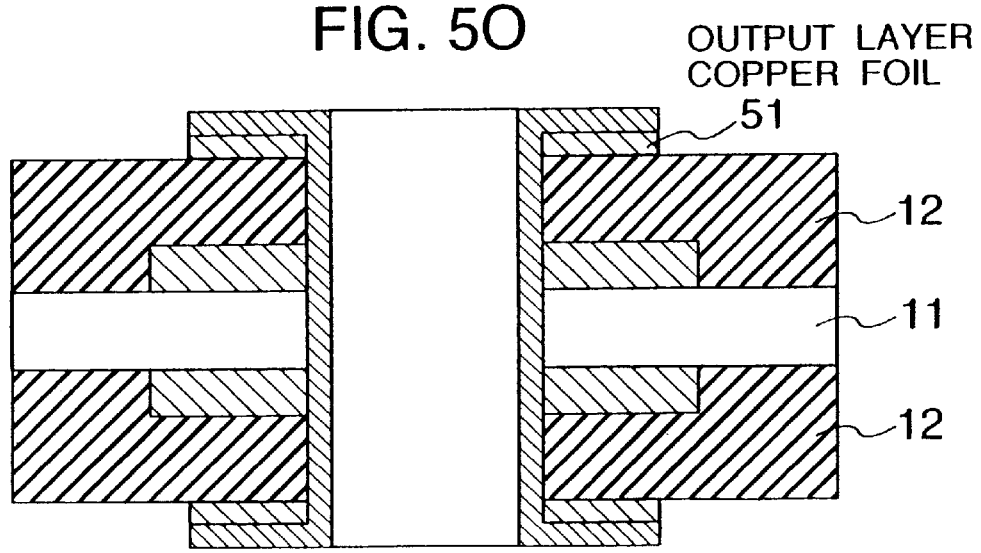

An 8-layer printed circuit board was manufactured by following the procedure of Example 18 except for use of a 50 μm thick B-stage polyamide-imide adhesive film composed of 100 parts by weight of the aromatic polyamide-imide resin obtained in Production Example 1, 21.7 parts by weight of a cresol novolak epoxy resin EOCN1020 (a trade name, mfd. by Nippon Kayaku Co., Ltd.) and 13.2 parts by weight of a cresol novolak phenol resin KA1160 (a trade name, mfd. by Dainippon Ink & Chemicals Inc.), said adhesive film in the cured form having the following properties: glass transition point=241° C.; linear expansion coefficient in the temperature range from glass transition point to 350° C.=170 ppm/° C.; storage elastic modulus at 300° C.=103 MPa. The resin flow of this film was 700 μm. The encircled portion in FIG. 5D is shown enlarged in FIG. 5O, the encirculed portion in FIG. 5H is shown enlarged in FIG. 5N, and the encircled portion in FIG. 5L is shown enlarged in FIG. 5N.

This circuit board had excellent solder heat resistance.

EXAMPLE 22

(Multilayer printed circuit board)

A 6-layer built-up printed circuit board was made by following the procedure of Example 19 except for use of a 50 μm thick B-stage polyamide-imide adhesive film composed of 100 parts by weight of the aromatic polyamide-imide resin obtained in Production Example 1, 21.7 parts by weight of EOCN1020 (a trade name, mfd. by Nippon Kayaku Co., Ltd.) and 13.2 parts by weight of KA1160 (a trade name, mfd. by Dainippon Ink & Chemicals Inc.), said adhesive film in the cured form having the following properties: glass transition point=241° C.; liner expansion coefficient in the temperature range from glass transition point to 350° C.=170 ppm/° C.; storage elastic modulus at 300° C.=103 MPa. This circuit board had excellent solder heat resistance.

EXAMPLE 23

(Multilayer printed circuit board)

An 8-layer built-up printed circuit board was made by following the procedure of Example 20 except for use of a 50 μm thick B-stage polyamide-imide adhesive film composed of 100 parts by weight of the aromatic polyamide-imide resin obtained in Production Example 1, 21.7 parts by weight of EOCN1020 (a trade name, mfd. by Nippon Kayaku Co., Ltd.) and 13.2 parts by weight of KA1160 (a trade name, mfd. by Dainippon Ink & Chemicals Inc.), said adhesive film in the cured form having the properties of glass transition point=241° C.; linear expansion coefficient in the temperature range from glass transition point to 350° C.=170 ppm/° C.; storage elastic modulus at 300° C.=103 MPa. This circuit board showed excellent solder heat resistance.

COMPARATIVE EXAMPLE 12

(Multilayer printed circuit board)

An 8-layer printed circuit board was manufactured by following the procedure of Example 18 except for use of a 50 μm B-stage polyamide-imide adhesive film composed of an aromatic polyamide-imide resin alone and having the properties, in the cured form thereof: glass transition point= 229° C.; linear expansion coefficient in the temperature range from glass transition point to 350° C.=6,400 ppm/° C.; storage elastic modulus at 300° C.=5.2 MPa.

This circuit board had voids in the adhesive film layers and was reduced in solder heat resistance after the solder heat resistance test.

As described above, according to the multilayer printed circuit boards of the present invention and their production process, it is possible to provide IVHs in multiple layers in registration with each other, high-density wiring is made possible, and the substrate surface flatness and heat resistance are improved. Thus, the present invention has the effect of realizing significant improvement of wiring properties, packaging reliability and heat resistance of the multiple printed circuit boards.

EXAMPLE 24

(Circuit board for chip carrier)

This example is explained with reference to FIGS. 6, 13A–13G, 14 and 15A–15E.

Figure 13A:
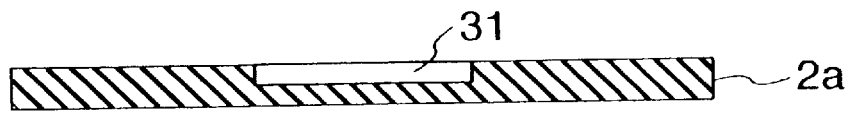
FIGS. 13A to 13G are schematic sectional views illustrating the steps for manufacturing a circuit board in an embodiment of the present invention.
Figure 13B:
Figure 13C:
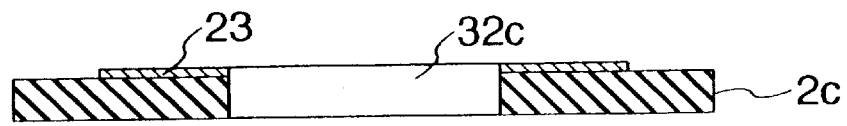
Figure 13D:
Figure 13E:
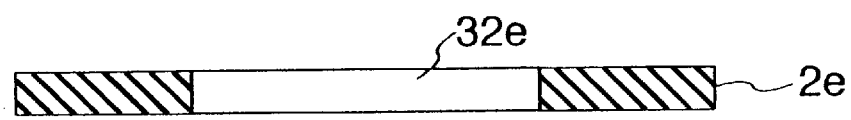
Figure 13F:
Figure 13G:

There were prepared:

(1) a substrate 2a such as shown in FIG. 13A, comprising a 0.4 mm thick BT resin-made single-side copper-clad laminate CCH-HL830 (a trade name, mfd. by Mitsubishi Gas Chemical Co., Ltd.) with its copper foil removed, one side of said laminate being counter bored to a depth of 0.2 mm to form a cavity 31, this substrate serving as an insulating layer;

(2) an adhesive film 1b designed to serve as an insulating adhesive layer, such as shown in FIG. 13B, comprising a 0.05 mm thick adhesive film composed of the aromatic polyamide-imide resin obtained in Production Example 1, an epoxy resin EOCN1020 (a trade name, mfd. by Nippon Kayaku K.K.) and a polyfunctional phenol KA1160 (a trade name, mfd. by Dainippon Ink and Chemicals Inc.) (100/21/11 by weight), and having the properties of: B-stage storage elastic modulus at 30° C.=3,000 MPa; C-stage storage elastic modulus at 300° C.=100 MPa; glass transition temperature=217° C., said film 1b having an opening 32b to become a cavity greater than the counter boring 31 in the substrate 2a;

(3) a substrate 2c such as shown in FIG. 13C, comprising a 0.4 mm thick BT resin-made single-side copper-clad laminate CCH-HL830 (a trade name, mfd. by Mitsubishi Gas Chemical Co., Ltd.) having a cavity opening 32c of the same size as the cavity opening 32b of the adhesive film 1b, in which conductor circuits 23 which become internal terminals for making electrical connection to semiconductor chips 26 by wire bonding 33 are formed at the portions exposed when this substrate 2c is superposed on the substrate 2e;

(4) an adhesive film 1d such as shown in FIG. 13D, comprising a 0.075 mm thick adhesive film made of the same material as (2) and having an opening 32 greater than the cavity opening 32d of the substrate 2c;

(5) a substrate 2e such as shown in FIG. 13E, comprising a 0.4 mm thick BT resin-made single-side copper-clad laminate CCH-HL830 (a trade name, mfd. by Mitsubishi Gas Chemical Co., Ltd.) with its copper foil removed, said substrate 2e having an opening 32e having the same size as the cavity opening 32d of the adhesive film 1d;

(6) an adhesive film 1f such as shown in FIG. 13F, comprising a 0.1 mm thick adhesive film made of the same material as (2) and having an opening 32f of the same size as the cavity opening 32e of the substrate 2e; and (7) a substrate 2g such as shown in FIG. 13G, comprising a 0.2 mm thick BT resin-made single-side copper-clad laminate CCH-HL830 (a trade name, mfd. by Mitsubishi Gas Chemical Co., Ltd.) with its copper foil removed.

Figure 14:
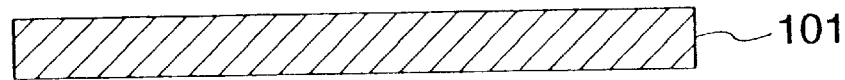
FIG. 14 is sectional views of individual components illustrating the method of manufacturing a multilayer wiring board in an embodiment of the present invention.
Figure 14:
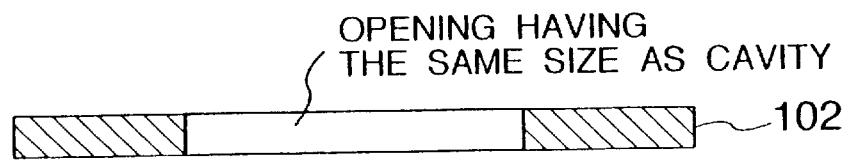
Figure 14:
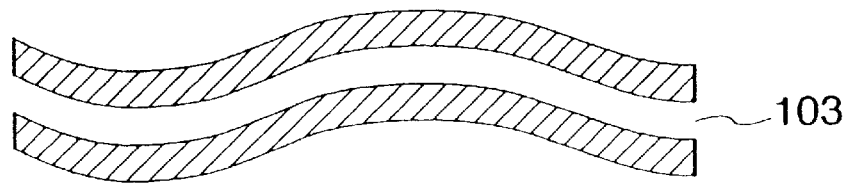
Figure 14:
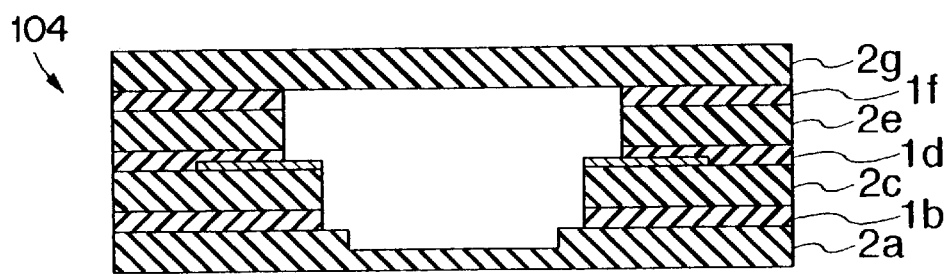
Figure 14:
Figure 14:
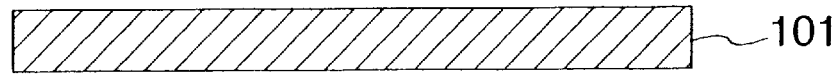

(8) Then, as shown in FIG. 14, a flat pannel 101, a protective film 105, a multilayer wiring board structure 104 consisting of (1)–(7) described above, a cushion 103, a molded article 102 having an opening of the same size as cavity, and a flat pannel 101 were placed one on another in this order and heat pressed under the conditions of 180° C., 30 kgf/cm$^2$ and 150 minutes for integral lamination.

Figure 15A:
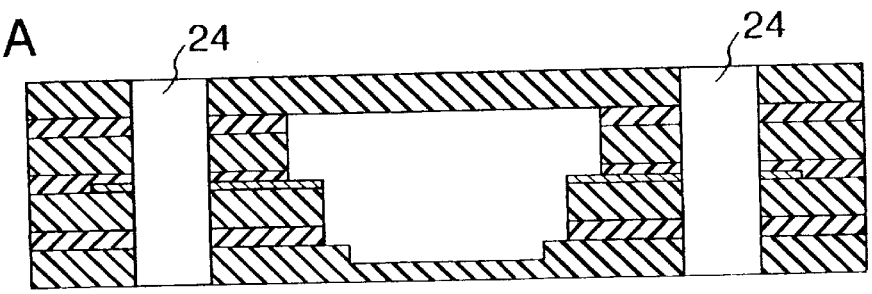
FIGS. 15A to 15E are schematic sectional views illustrating the method of manufacturing a circuit board for chip carrier in an embodiment of the present invention.
Figure 15B:
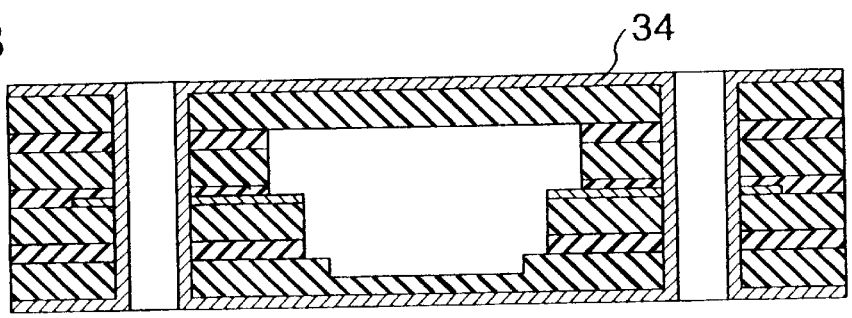
Figure 15C:
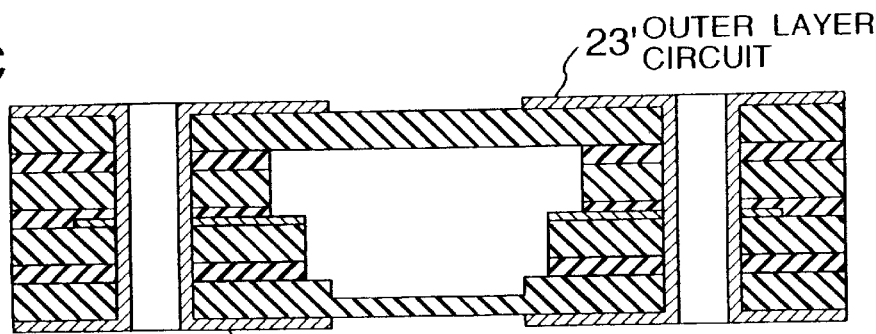
Figure 15D:
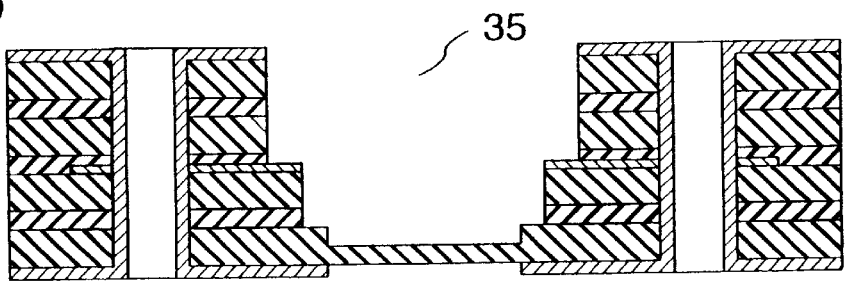
Figure 15E:
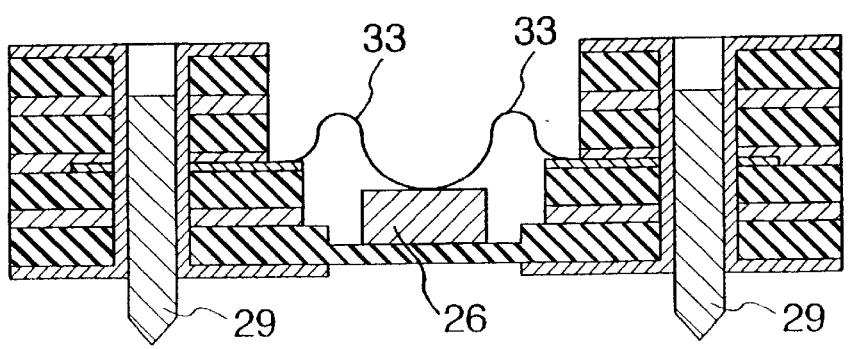

(9) The thus obtained laminate was drilled to form through holes 24 as shown in FIG. 15A, followed by electroless plating 34 on the inner walls of the holes and the surfaces of the laminate as shown in FIG. 15B. Unnecessary copper was removed by etching to form outer layer conductor circuits 23' as shown in FIG. 15C. Further, as shown in FIG. 15D, a pertinent part of the substrate 2g was routed to form an opening 35 of the same size as the cavity opening 32e of the substrate 2e in alignment therewith, and then a plurality of pins 29 were fixed in the respective through holes 24 to make a pin grid array having a cavity (FIG. 15E).

EXAMPLE 25

(Circuit board for chip carrier)

Figure 16A:
FIGS. 16A to 16I are schematic sectional views illustrating the steps for manufacturing a circuit board for chip carrier in another embodiment of the present invention.
Figure 16B:
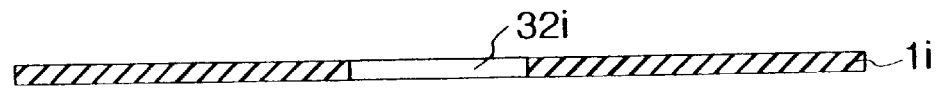
Figure 16C:
Figure 16D:
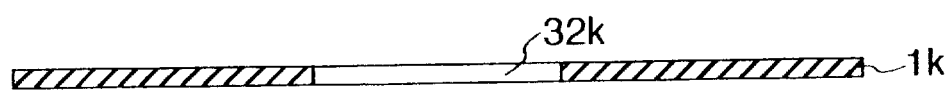
Figure 16E:
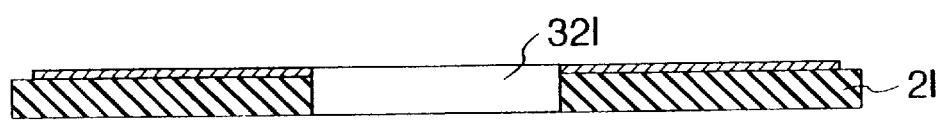
Figure 16F:
Figure 16G:
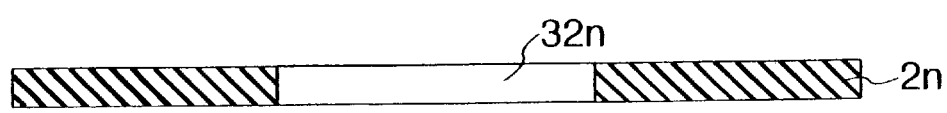
Figure 16H:
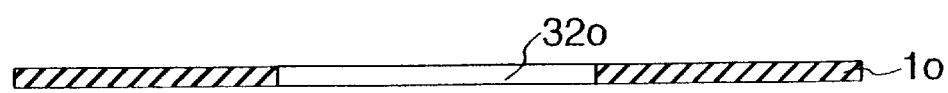
Figure 16I:

There were prepared:

(1) a substrate 2h serving as insulating layer, such as shown in FIG. 16A, comprising a 0.2 mm thick BT resin-made single-side copper-clad laminate CCH-HL830 (a trade name, mfd. by Mitsubishi Gas Chemical Co., Ltd.) with its copper foil removed;

(2) an adhesive film 1i serving as insulating adhesive layer, such as shown in FIG. 16B, comprising a 0.05 mm thick adhesive film made of the same material as (2) of Example 24 and having a cavity opening 32i;

(3) a substrate 2j such as shown in FIG. 16C, comprising a 0.4 mm thick BT resin-made single-side copper-clad laminate CCH-HL830 (a trade name, mfd. by Mitsubishi Gas Chemical Co., Ltd.) having an opening 32 of the same size as the cavity opening 32 of the adhesive film 1i, in which conductor circuits 23 serving as internal terminals for electrical connection to semiconductor chips 26 by bonding wires 33 are formed at the portions exposed when this substrate 2j is placed on the substrate 2l;

(4) an adhesive film 1k such as shown in FIG. 16D, comprising a 0.05 mm thick adhesive film made of the same material as (2) and having an opening 32k greater than the cavity opening 32j of the substrate 2j;

(5) a substrate 2l such as shown in FIG. 16E, comprising a 0.4 mm thick BT resin-made single-side copper-clad laminate CCH-HL830 (a trade name, mfd. by Mitsubishi Gas Chemical Co., Ltd.) having an opening 32l of the same size as the cavity opening 32k of the adhesive film 1k, in which conductor circuits 23 serving as internal terminals for electrical connection to semiconductor chips 26 by bonding wires 33 are formed at the portions exposed when this substrate 2l is seton the substrate 2n;

(6) an adhesive film 1m such as shown in FIG. 16F, comprising a 0.05 mm thick adhesive film made of the same material as (2) and having an opening 32m greater than the cavity opening 32l of the substrate 2l;

(7) a substrate 2n such as shown in FIG. 16G, comprising a 0.4 mm thick BT resin-made single-side copper-clad laminate CCH-HL830 (a trade name, mfd. by Mitsubishi Gas Chemical Co., Ltd.) with its copper foil removed, having an opening 32n of the same size as the cavity opening 32m of the adhesive film 1m;

(8) an adhesive film 1o such as shown in FIG. 16H, comprising a 0.05 mm thick adhesive film made of the same material as (2) and having an opening 32o of the same size as the cavity opening 32n of the substrate 1n; and (9) a substrate 2p such as shown in FIG. 16I, comprising a 0.4 mm thick BT resin-made single-side copper-clad laminate CCH-HL830 (a trade name, mfd. by Mitsubishi Gas Chemical Co., Ltd.) with its copper foil removed.

(10) As shown in FIG. 14, a flat pannel 101, a protective film 105, a multilayer wiring board structure 104 consisting of (1)–(9), a cushion 103, a molded article 102 having a cavity opening, and a flat pannel 101 were placed one upon another in this order and heat pressed under the conditions of 180° C., 30 kgf/cm$^2$ and 150 minutes for integral lamination.

Figure 17A:
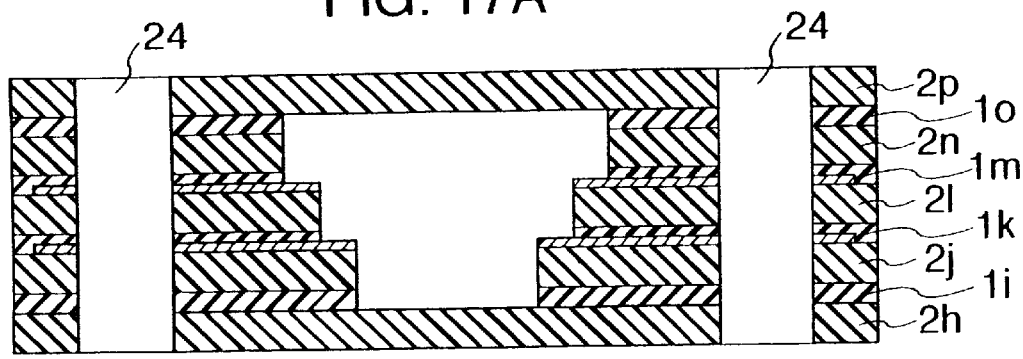
FIGS. 17A to 17D are schematic sectional views illustrating the method of manufacturing a circuit board for chip carrier in still another embodiment of the present invention.
Figure 17B:
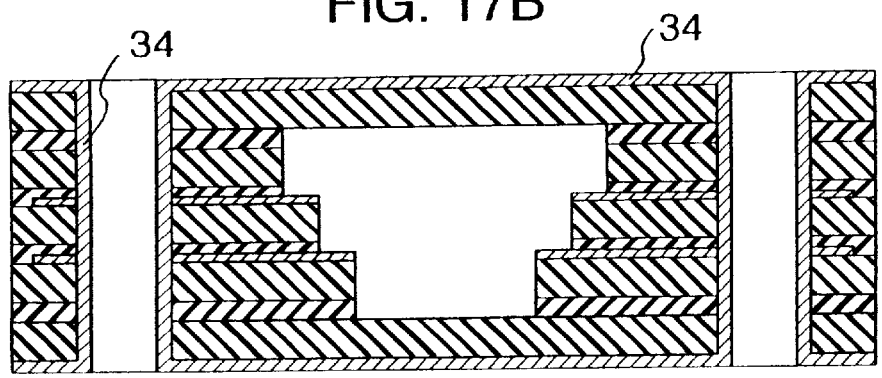
Figure 17C:
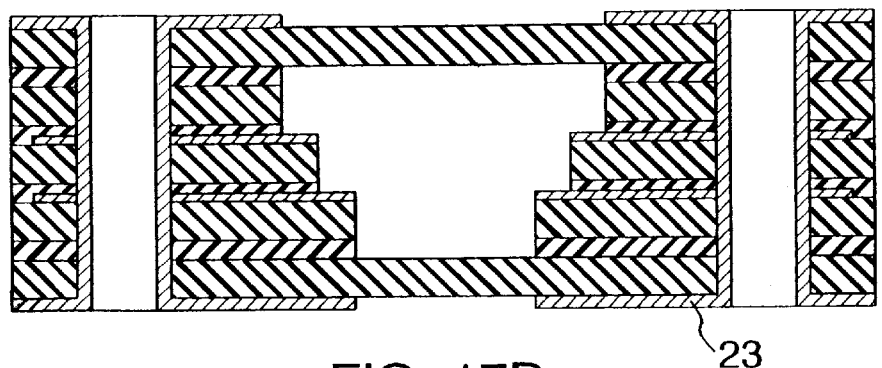
Figure 17D:
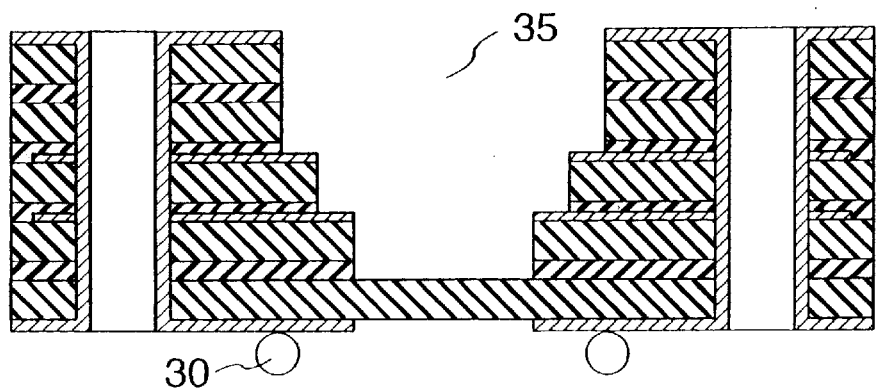

(11) The thus obtained laminate was drilled to form through holes 24 as shown in FIG. 17A, followed by electroless plating 34 on the inner walls of the holes and the surfaces of the laminate as shown in FIG. 17B. Then conductor circuits 23 including lands for fusion bonding solder balls 30 were formed as shown in FIG. 17C, and further a pertinent part of the substrate 2p was routed to form an opening 35 of the same size as and in alignment with the opening 32n of the substrate 2n as shown in FIG. 17D, followed by coating with a solder resist and drying to make a ball grid array.

EXAMPLE 26
(Circuit board for chip carrier)

A pin grid array was produced by following the same procedure as Example 24 except that through holes were formed instead of counter boring 31 in the substrate 2a, and that a heat sink 28 having a brim portion such as shown in FIG. 10 was prepared, and the laminate structure was composed of a flat pannel 101, a cushion 103, a low-melting film 111, a high-melting film 110, a multilayer wiring board structure 104 consisting of insulating layers and substrates with insulating adhesive layers 21 interposed therebetween, a cushion 103, a molded article 102 having a cavity hole, and a flat pannel 101, which were placed one upon another in this order as shown in FIG. 11B.

EXAMPLES 27–29
(Circuit boards for chip carriers)

Pin grid arrays or ball grid arrays were produced by following the procedures of Examples 24–26 except that the BT resin-made single-side copper-clad laminate CCH-HL830 (a trade name, mfd. by Mitsubishi Gas Chemical Co., Ltd.) was replaced by an epoxy resin-impregnated glass cloth-reinforced copper-clad laminate MCL-E-67 (a trade name, mfd. by Hitachi Chemical Co., Ltd.).

EXAMPLE 30
(Circuit board for chip carrier)

Figure 18A:
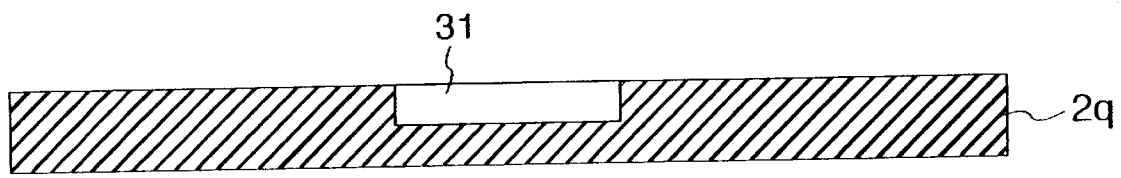
FIGS. 18A to 18K are schematic sectional views illustrating the method of manufacturing a circuit board for chip carrier in yet another embodiment of the present invention.
Figure 18B:
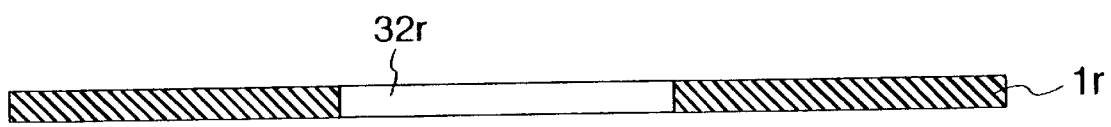
Figure 18C:
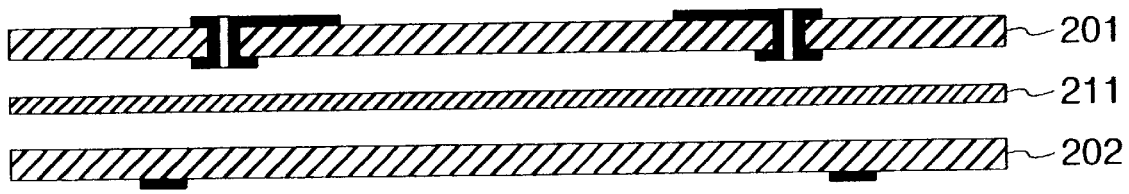
Figure 18D:
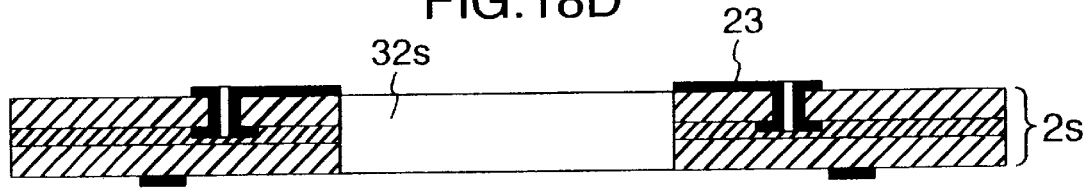
Figure 18E:
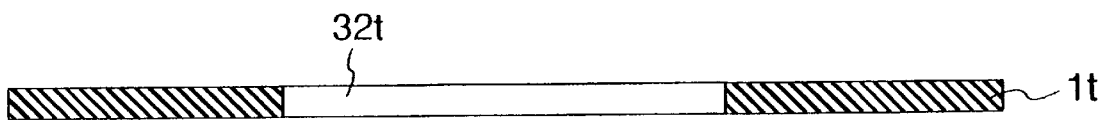
Figure 18F:
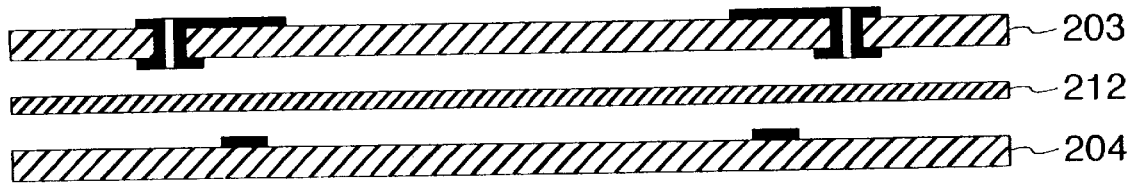
Figure 18G:
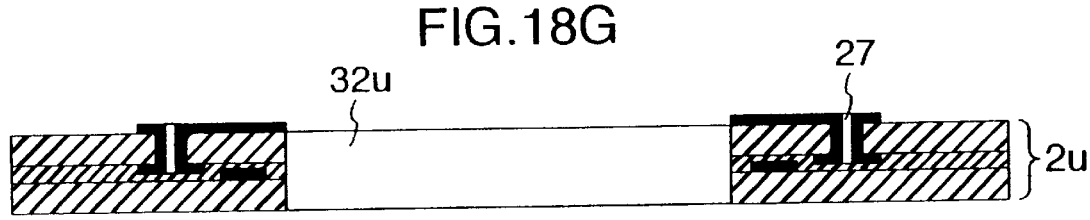
Figure 18H:
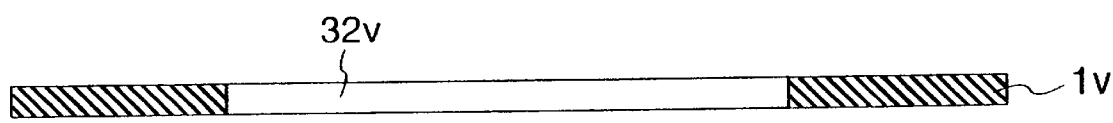
Figure 18I:
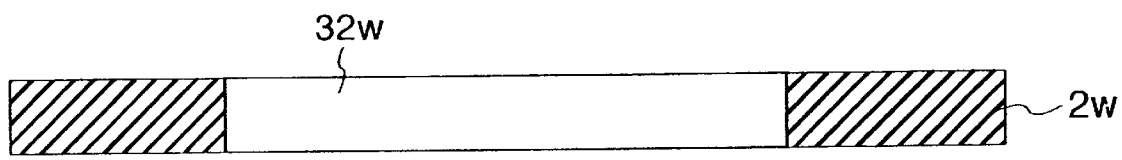
Figure 18J:
Figure 18K:

There were prepared:

(1) a substrate 2q serving as an insulating layer 22, such as shown in FIG. 18A, comprising a 0.2 mm thick epoxy resin-impregnated glass cloth-reinforced copper-clad laminate MCL-E-67 (a trade name, mfd. by Hitachi Chemical Co., Ltd.) with its copper foil removed, one side of the laminate being counter bored to a depth of 0.1 mm to form a recess 31 which becomes a cavity;

(2) an adhesive film 1r serving as an insulating adhesive layer 22, such as shown in FIG. 18B, comprising a 0.05 mm thick adhesive film made of the same material as (2) of Example 24 and having a cavity opening 32r greater than counter boring 31 of the substrate 2q;

(3) a substrate 2s obtained by laminating and bonding two units 201 and 202 of 0.1 mm thick epoxy resin-impregnated glass cloth-reinforced copper-clad laminate MCL-E-67 (a trade name, mfd. by Hitachi Chemical Co., Ltd.) with a 0.1 mm thick adhesive film 211 interposed therebetween as shown in FIG. 18C, under the conditions of 180° C. and 30 kgf/cm$^2$ for 60 minutes, each of said laminate units 201 and 202 being provided with conductor circuits 23 and holes which later become via holes 27, and said adhesive film 211 being made of the same material as (2), the substrate 2s having an opening 32s of the same size as the cavity opening 32r of the adhesive film 1r as shown in FIG. 18D, and also provided with conductor circuits 23 serving as internal terminals for making electrical connection to semiconductor chips 26 by wire bonding 33 at the portions exposed when this substrate is laid on the substrate 2u;

(4) an adhesive film 1t such as shown in FIG. 18E, comprising a 0.05 mm thick adhesive film made of the same material as (2)and having an opening 32t greater than the cavity opening 32s of the substrate 2s;

(5) a substrate 2u comprising two units 203 and 204 of 0.1 mm thick epoxy resin-impregnated glass cloth-reinforced copper-clad laminate MCL-E-67 (a trade name, mfd. by Hitachi Chemical Co., Ltd.) which were laminated and bonded together with a 0.1 mm thick adhesive film 212 interposed therebetween as shown in FIG. 18F under the conditions of 180° C. and 30 kgf/cm$^2$ for 60 minutes, each of said laminate units 203 and 204 being provided with conductor circuits 23 and holes which become via holes 27, and said adhesive film 212 being made of the same material as (2), the substrate 2u having an opening 32u of the same size as the cavity opening 32t of the adhesive film 1t, and also provided with conductor circuits 23 serving as internal terminals for making electrical connection to semiconductor chips 26 by bonding wires 33 at the portions exposed when this substrate 2u is placed on the substrate 2w;

(6) an adhesive film 1v such as shown in FIG. 18H, comprising a 0.05 mm thick adhesive film made of the same material as (2) and having an opening 32v greater than the cavity opening 32u of the substrate 2u;

(7) a substrate 2w such as shown in FIG. 18I, comprising a 0.4 mm thick epoxy resin-impregnated glass cloth-reinforced copper-clad laminate MCL-E-67 (a trade name, mfd. by Hitachi Chemical Co., Ltd.) with its copper foil removed, said laminate having an opening 32w of the same size as the cavity opening 32v of the adhesive film 1v;

(8) an adhesive film 1x such as shown in FIG. 18J, comprising a 0.05 mm thick adhesive film made of the same material as (2) and having an opening 32x of the same size as the cavity opening 32w of the substrate 2w; and (9) a substrate 2y such as shown in FIG. 18K, comprising a 0.4 mm thick epoxy resin-impregnated glass cloth-reinforced copper-clad laminate MCL-E-67 (a trade name, mfd. by Hitachi Chemical Co., Ltd.) with its copper foil removed.

(10) As shown in FIG. 14, a flat pannel 101, a protective film 105, a multilayer wiring board structure 104 consisting of (1)–(9), a cushion 103, a molded article 102 having a cavity hole, and a flat pannel 101 were placed one upon another in this order and heat pressed under the conditions of 180° C., 30 kgf/cm$^2$ and 150 minutes for integral lamination.

Figure 19:
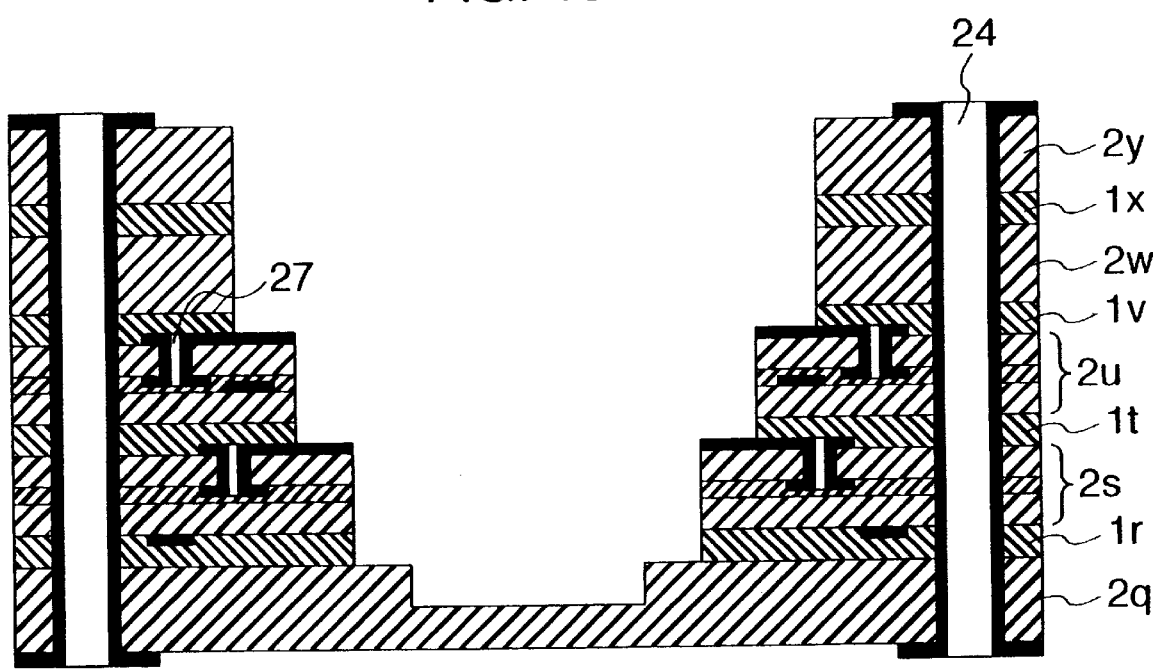
FIG. 19 is a schematic sectional view illustrating the structure of a circuit board for chip carrier in still another embodiment of the present invention.

(11) The thus obtained laminate was drilled to form through holes 24, followed by electroless plating 24 on the inner walls of the holes and the surfaces of the laminate and by succeeding electroplating to form outer layer conductor circuits 23. Further, for forming a cavity, a pertinent part of the substrate 2y was routed to form an opening 35 of the same size as and in alignment with the cavity opening 32w of the substrate 2w, thereby producing a wiring board for chip carrier such as shown in FIGS. 19.

EXAMPLES 31–34
(Circuit boards for chip carriers)

Pin grid arrays or ball grid arrays or wiring boards for chip carrier were produced by following the procedures of Examples 24–26 and 30 except that the BT resin-made single-side copper-clad laminate CCH-HL830 (a trade name, mfd. by Mitsubishi Gas Chemical Co., Ltd.) in Examples 24–26 and the epoxy resin-impregnated glass cloth-reinforced copper-clad laminate ML-E-67 (a trade name, mfd. by Hitachi Chemical Co., Ltd.) in Example 30 were replaced by a polyimide resin-impregnated glass cloth-reinforced copper-clad laminate MCL-I-671 (a trade name, mfd. by Hitachi Chemical Co., Ltd.).

EXAMPLES 35–45
(Circuit boards for chip carriers)

Pin grid arrays or ball grid arrays or wiring boards for chip carrier were produced by following the procedures of Examples 24–34 except that each insulating adhesive layer was replaced by an adhesive film composed of an aromatic polyamide-imide resin having a B-stage elastic modulus at 30° C. of 3,500 MPa, a C-stage elastic modulus at 300° C. of 170 MPa a glass transition temperature of 223° C., EOCN1020 (an epoxy resin mfd. by Nippon Kayaku Co., Ltd.) and KA1160 (a polyfunctional phenol mfd. by Dainippon Ink & Chemicals Inc.) in a weight ratio of 100/43/23.

COMPARATIVE EXAMPLES 13–20
(Circuit boards for chip carriers)

Pin grid arrays or ball grid arrays or wiring boards for chip carrier were produced by following the procedures of Examples 24–31 except that each insulating adhesive layer was replaced by an adhesive film composed solely of a polyamide-imide resin having a B-stage elastic modulus at 30° C. of 2,500 MPa, a C-stage elastic modulus at 300° C. of 5.2 MPa and a glass transition temperature of 229° C.

COMPARATIVE EXAMPLES 21–28
(Circuit boards for chip carriers)

Pin grid arrays or ball grid arrays or wiring boards for chip carrier were produced by following the procedures of Examples 24–31 except that each insulating adhesive layer was replaced by an adhesive film composed of said aromatic polyamide-imide resin, EOCN1020 (an epoxy resin mfd. by Nippon Kayaku Co., Ltd.) and KA1160 (a polyfunctional phenol mfd. by Dainippon Ink & Chemicals Inc.) in a weight ratio of 100/98/58.

The thus produced circuit boards for chip carriers initially had no voids and suffered no delamination. However, when they were subjected to a 2-minute solder flow test at 260° C., although the boards of Examples 24–45 formed no voids in and caused no peeling of the insulating adhesive layers, the boards of Comparative Examples 13–20 produced a large number of voids in and suffered extensive peeling of the insulating adhesive layers due to low storage elastic modulus of the adhesive layers in C-stage. In the case of the compositions of Comparative Examples 21–28, because of high ratio of the thermosetting resin component, some suffered gelation when stirred while the others were incapable of forming a film, making it impossible to make a circuit board for chip carrier.

As described above, according to the present invention, there are provided the circuit boards for chip carriers having good B-stage handling properties and excellent connection reliability and heat resistance, and a production process therefor, by incorporating in the boards the insulating adhesive layers having preferably a B-stage storage elastic modulus at 30° C. of 1,000 to 5,000 MPa, a C-stage storage elastic modulus at 300° C. of 30 MPa or more, and a glass transition temperature of 180° C. or higher.

What is claimed is:

1. A multilayer printed circuit board comprising a plurality of insulating substrate having conductor circuits thereon, insulating adhesive layers interposed between these insulating substrates alternately, and a plurality of plated through holes electrically connecting conductor circuits, said insulating adhesive layer having a storage elastic modulus at 300° C. of 30 MPa or more and a glass transition temperature of 180° C. or higher, and made from an adhesive composition comprising a polyamide-imide resin and a thermosetting component, wherein the adhesive composition comprises (a) 100 parts by weight of said polyamide-imide resin, said polyamide-imide resin having a molecular weight of 80,000 or more, and (b) 10 to 150 parts by weight of said thermosetting component, said thermosetting component comprising an epoxy resin and a curing agent therefor and/or a curing accelerator therefor, wherein the polyamide-imide resin is an aromatic polyamide-imide resin obtained by reacting an aromatic diimide carboxylic acid, which is obtained by reacting a diamine having 3 or more aromatic rings with trimellitic anhydride, with an aromatic diisocyanate, and wherein the diamine having 3 or more aromatic rings is at least one member selected from the group consisting of 2,2-bis[4-(4-aminophenoxy)phenyl]propane, bis[4-(3-aminophenoxy)phenyl]sulfone, bis[4-(4-aminophenoxy)phenyl]sulfone, 2,2-bis[4-(4-aminophenoxy)phenyl]hexafluoropropane, bis[4-(4-aminophenoxy)phenyl]methane, 4,4-bis-(4-aminophenoxy)biphenyl, bis[4-(4-aminophenoxy)phenyl]ether, bis[4-(4-aminophenoxy)phenyl]ketone, 1,3-bis(4-aminophenoxy)benzene, and 1,4-bis(4-aminophenoxy)benzene, and the aromatic diisocyanate is at least one member selected from the group consisting of 4,4'-diphenylmethane diisocyanate, 2,4-tolylene diisocyanate, 2,6-tolylene diisocyanate, naphthalene-1,5-diisocyanate, and 2,4-tolylene dimer.

2. A wire scribed circuit board comprising an insulating substrate having conductor circuit thereon, an insulating adhesive layer formed thereon, a plurality of wires having an insulating coating and fixed in said insulating adhesive layer, and a plurality of plated through holes formed in portions necessary for electrical connection, said insulating adhesive layer having a storage elastic modulus at 300° C. of 30 MPa or more and a glass transition temperature of 180° C. or higher, and made from an adhesive composition comprising a polyamide-imide resin and a thermosetting component, wherein the adhesive composition comprises (a) 100 parts by weight of the polyamide-imide resin, said polyamide-imide resin having a molecular weight of 80,000 or more, and (b) 10 to 150 parts by weight of said thermosetting component, said thermosetting component comprising an epoxy resin and a curing agent therefor and/or a curing accelerator therefor, wherein the polyamide-imide resin is an aromatic polyamide-imide resin obtained by reacting an aromatic diimide carboxylic acid, which is obtained by reacting a diamine having 3 or more aromatic rings with trimellitic anhydride, with an aromatic diisocyanate, and wherein the diamine having 3 or more aromatic rings is at least one member selected from the group consisting of 2,2-bis[4-(4-aminophenoxy)phenyl]propane, bis[4-(3-aminophenoxy)phenyl]sulfone, bis[4-(4-aminophenoxy)phenyl]sulfone, 2,2-bis[4-(4-aminophenoxy)phenyl]hexafluoropropane, bis[4-(4-aminophenoxy)phenyl]methane, 4,4-bis-(4-aminophenoxy)biphenyl, bis[4-(4-aminophenoxy)phenyl]ether, bis[4-(4-aminophenoxy)phenyl]ketone, 1,3-bis(4-aminophenoxy)benzene, and 1,4-bis(4-aminophenoxy)benzene, and the aromatic diisocyanate is at least one member selected from the group consisting of 4,4'-diphenylmethane diisocyanate, 2,4-tolylene diisocyanate, 2,6-tolylene diisocyanate, naphthalene-1,5-diisocyanate, and 2,4-tolylene dimer.

3. A circuit board for chip carrier comprising:

a plurality of insulating layers, a plurality of interlayer substrates each having conductor circuits thereon, a plurality of insulating adhesive layers, each insulating adhesive layer bonding each insulating layer and each interlayer substrate or each insulating layer, a plurality of through holes having conductors on inner wall surfaces thereof and electrically connected to the conductor circuits, and a cavity for housing at least one semiconductor chip, each insulating adhesive layer having a storage elastic modulus at 300° C. of 30 MPa or more and a glass transition temperature of 180° C. or higher, and made from an adhesive composition comprising a polyamide-imide resin and a thermosetting component, wherein the adhesive composition comprises (a) 100 parts by weight of said polyamide-imide resin, said polyamide-imide resin having a molecular weight of 80,000 or more, and (b) 10 to 150 parts by weight of said thermosetting component, said thermosetting component comprising an epoxy resin and a curing agent therefor and/or a curing accelerator therefor, wherein the polyamide-imide resin is an aromatic polyamide-imide resin obtained by reacting an aromatic diimide carboxylic acid, which is obtained by reacting a diamine having 3 or more aromatic rings with trimellitic anhydride, with an aromatic diisocyanate, and wherein the diamine having 3 or more aromatic rings is at least one member selected from the group consisting of 2,2-bis[4-(4-aminophenoxy)phenyl]propane, bis[4-(3-aminophenoxy)phenyl]sulfone, bis[4-(4-aminophenoxy)phenyl]sulfone, 2,2-bis[4-(4-aminophenoxy)-phenyl]hexafluoropropane, bis[4-(4-aminophenoxy)-phenyl]methane, 4,4-bis-(4-aminophenoxy)biphenyl, bis[4-(4-aminophenoxy)phenyl]ether, bis[4-(4-aminophenoxy)phenyl]ketone, 1,3-bis(4-aminophenoxy)benzene, and 1,4-bis(4-aminophenoxy)benzene, and the aromatic diisocyanate is at least one member selected from the group consisting of 4,4'-diphenylmethane diisocyanate, 2,4-tolylene diisocyanate, 2,6-tolylene diisocyanate, naphthalene-1,5-diisocyanate, and 2,4-tolylene dimer.

* * * * *